United States Patent
Breen et al.

(10) Patent No.: US 10,008,631 B2
(45) Date of Patent: **\*Jun. 26, 2018**

(54) COATED SEMICONDUCTOR NANOCRYSTALS AND PRODUCTS INCLUDING SAME

(71) Applicant: SAMSUNG ELECTRONICS CO., LTD., Suwon-si (KR)

(72) Inventors: Craig Breen, Somerville, MA (US); Wenhao Liu, Billerica, MA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 153 days.

This patent is subject to a terminal disclaimer.

(21) Appl. No.: 14/521,225

(22) Filed: Oct. 22, 2014

(65) Prior Publication Data

US 2015/0171268 A1  Jun. 18, 2015

Related U.S. Application Data

(63) Continuation of application No. PCT/US2012/066158, filed on Nov. 20, 2012, and a
(Continued)

(51) Int. Cl.
*H01L 33/06* (2010.01)
*H01L 33/30* (2010.01)
(Continued)

(52) U.S. Cl.
CPC .............. *H01L 33/06* (2013.01); *C09D 11/52* (2013.01); *C09K 11/02* (2013.01); *C09K 11/565* (2013.01);
(Continued)

(58) Field of Classification Search
None
See application file for complete search history.

(56) References Cited

U.S. PATENT DOCUMENTS

| | | | |
|---|---|---|---|
| 3,760,000 A | 9/1973 | Curry | |
| 6,207,229 B1 * | 3/2001 | Bawendi | C01B 17/20 257/E33.004 |

(Continued)

FOREIGN PATENT DOCUMENTS

| | | |
|---|---|---|
| CN | 101294071 A | 10/2008 |
| CN | 102017147 | 4/2011 |

(Continued)

OTHER PUBLICATIONS

Copending U.S. Appl. No. 14/451,125 and U.S. Appl. No. 14/284,265.*
(Continued)

*Primary Examiner* — Katie L Hammer
(74) *Attorney, Agent, or Firm* — Cantor Colburn LLP

(57) ABSTRACT

A coated quantum dot is provided wherein the quantum dot is characterized by having a solid state photoluminescence external quantum efficiency at a temperature of 90° C. or above that is at least 95% of the solid state photoluminescence external quantum efficiency of the semiconductor nanocrystal at 25° C. Products including quantum dots described herein are also disclosed.

19 Claims, 6 Drawing Sheets

Related U.S. Application Data continuation-in-part of application No. 14/451,125, filed on Aug. 4, 2014, which is a continuation of application No. PCT/US2012/066154, filed on Nov. 20, 2012, application No. 14/521,225, which is a continuation-in-part of application No. 14/284,265, filed on May 21, 2014, which is a continuation of application No. PCT/US2012/066145, filed on Nov. 20, 2012.

(60) Provisional application No. 61/636,702, filed on Apr. 22, 2012, provisional application No. 61/595,116, filed on Feb. 5, 2012, provisional application No. 61/678,902, filed on Aug. 2, 2012, provisional application No. 61/562,463, filed on Nov. 22, 2011, provisional application No. 61/636,701, filed on Apr. 22, 2012, provisional application No. 61/678,883, filed on Aug. 2, 2012.

(51) Int. Cl.
| H01L 33/28 | (2010.01) |
| H01L 33/00 | (2010.01) |
| C09K 11/02 | (2006.01) |
| C09K 11/56 | (2006.01) |
| C09D 11/52 | (2014.01) |
| C09K 11/88 | (2006.01) |
| B82Y 20/00 | (2011.01) |
| H01L 33/50 | (2010.01) |
| B82Y 30/00 | (2011.01) |

(52) U.S. Cl.
CPC ........ *C09K 11/883* (2013.01); *H01L 33/0029* (2013.01); *H01L 33/28* (2013.01); *B82Y 20/00* (2013.01); *B82Y 30/00* (2013.01); *H01L 33/502* (2013.01); *Y10S 977/774* (2013.01); *Y10S 977/95* (2013.01)

(56) References Cited

U.S. PATENT DOCUMENTS

| 6,322,901 | B1 | 11/2001 | Bawendi et al. |
| 6,600,175 | B1 | 7/2003 | Baretz et al. |
| 6,607,829 | B1 | 8/2003 | Bawendi |
| 6,608,332 | B2 | 8/2003 | Shimizu et al. |
| 6,815,064 | B2 | 11/2004 | Treadway et al. |
| 6,872,249 | B2 | 3/2005 | Peng et al. |
| 7,147,712 | B2 | 12/2006 | Zehnder et al. |
| 7,229,497 | B2 | 6/2007 | Stott et al. |
| 7,267,810 | B2 | 9/2007 | Yu et al. |
| 7,476,599 | B2 | 1/2009 | Wang et al. |
| 7,482,059 | B2 | 1/2009 | Peng et al. |
| 7,557,028 | B1 | 7/2009 | Scher et al. |
| 7,615,800 | B2 | 11/2009 | Kahen |
| 7,767,260 | B2 | 8/2010 | Peng et al. |
| 7,777,233 | B2 | 8/2010 | Kahen et al. |
| 7,824,731 | B2 | 11/2010 | Ying et al. |
| 7,855,091 | B1 | 12/2010 | Kar et al. |
| 7,919,012 | B2 | 4/2011 | Peng et al. |
| 8,088,483 | B1 | 1/2012 | Whiteford et al. |
| 8,354,785 | B2 | 1/2013 | Clough et al. |
| 8,377,333 | B2 | 2/2013 | Ramprasad et al. |
| 8,404,154 | B2 | 3/2013 | Breen et al. |
| 8,643,064 | B2 | 2/2014 | Tian et al. |
| 8,691,114 | B2 | 4/2014 | Ramprasad et al. |
| 8,718,437 | B2 | 5/2014 | Coe-Sullivan et al. |
| 8,906,265 | B2 | 12/2014 | Breen et al. |
| 8,980,133 | B2 | 3/2015 | Ramprasad |
| 9,054,329 | B2 | 6/2015 | Coe-Sullivan et al. |
| 9,136,428 | B2 | 9/2015 | Clough et al. |
| 9,139,435 | B2 | 9/2015 | Breen et al. |
| 9,196,781 | B2 | 11/2015 | Tian et al. |
| 2002/0106849 | A1 | 8/2002 | Moore |
| 2003/0097976 | A1 | 5/2003 | Zehnder et al. |
| 2003/0145779 | A1 | 8/2003 | Alivisatos et al. |
| 2003/0186914 | A1 | 10/2003 | Hofer et al. |
| 2003/0227116 | A1 | 12/2003 | Halik et al. |
| 2004/0110002 | A1* | 6/2004 | Kim ............ B82Y 10/00 428/379 |
| 2004/0178390 | A1 | 9/2004 | Whiteford et al. |
| 2006/0110279 | A1 | 5/2006 | Hau et al. |
| 2006/0157720 | A1 | 7/2006 | Bawendi et al. |
| 2006/0170331 | A1 | 8/2006 | Bertram et al. |
| 2007/0059527 | A1 | 3/2007 | Jun et al. |
| 2007/0104865 | A1 | 5/2007 | Pickett |
| 2007/0128439 | A1 | 6/2007 | Kim et al. |
| 2007/0170418 | A1* | 7/2007 | Bowers ............ B82Y 20/00 257/14 |
| 2007/0201056 | A1 | 8/2007 | Cok et al. |
| 2007/0295266 | A1 | 12/2007 | Lee et al. |
| 2008/0012031 | A1 | 1/2008 | Jang et al. |
| 2008/0084706 | A1 | 4/2008 | Roshan et al. |
| 2008/0099728 | A1 | 5/2008 | Jin et al. |
| 2008/0118755 | A1 | 5/2008 | Whiteford et al. |
| 2008/0160306 | A1 | 7/2008 | Mushtaq et al. |
| 2008/0188063 | A1 | 8/2008 | Alivisatos et al. |
| 2008/0202383 | A1 | 8/2008 | Shi |
| 2008/0207581 | A1 | 8/2008 | Whiteford et al. |
| 2008/0220593 | A1 | 9/2008 | Pickett et al. |
| 2008/0252209 | A1 | 10/2008 | Jang et al. |
| 2008/0264473 | A1 | 10/2008 | Cumpston et al. |
| 2008/0268248 | A1 | 10/2008 | Jang et al. |
| 2008/0296144 | A1 | 12/2008 | Strouse et al. |
| 2008/0316576 | A1 | 12/2008 | Molenkamp et al. |
| 2009/0073349 | A1 | 3/2009 | Park et al. |
| 2009/0162011 | A1 | 6/2009 | Coe-Sullivan et al. |
| 2009/0181478 | A1 | 7/2009 | Cox et al. |
| 2009/0203196 | A1 | 8/2009 | Kim et al. |
| 2009/0217970 | A1 | 9/2009 | Zimmerman et al. |
| 2009/0230382 | A1 | 9/2009 | Banin et al. |
| 2009/0278141 | A1 | 11/2009 | Coe-Sullivan et al. |
| 2009/0302304 | A1 | 12/2009 | Peng et al. |
| 2010/0009338 | A1 | 1/2010 | Zhang et al. |
| 2010/0052512 | A1* | 3/2010 | Clough ............ B82Y 30/00 313/498 |
| 2010/0062154 | A1 | 3/2010 | Shin et al. |
| 2010/0090164 | A1 | 4/2010 | Peng et al. |
| 2010/0108530 | A1 | 5/2010 | Zehnder et al. |
| 2010/0140586 | A1* | 6/2010 | Char ............ B82Y 10/00 257/14 |
| 2010/0159248 | A1 | 6/2010 | Jang et al. |
| 2010/0163800 | A1 | 7/2010 | Peng et al. |
| 2010/0226849 | A1 | 9/2010 | Peng |
| 2010/0258789 | A1 | 10/2010 | Akai et al. |
| 2010/0264371 | A1 | 10/2010 | Nick |
| 2010/0265307 | A1 | 10/2010 | Linton et al. |
| 2010/0276638 | A1 | 11/2010 | Liu et al. |
| 2010/0283014 | A1 | 11/2010 | Breen et al. |
| 2010/0283036 | A1 | 11/2010 | Coe-Sullivan et al. |
| 2010/0283072 | A1* | 11/2010 | Kazlas ............ G02B 6/005 257/98 |
| 2010/0289003 | A1 | 11/2010 | Kahen et al. |
| 2010/0289044 | A1 | 11/2010 | Krames et al. |
| 2010/0308272 | A1 | 12/2010 | Peng et al. |
| 2011/0006285 | A1 | 1/2011 | Lifshitz et al. |
| 2011/0031452 | A1 | 2/2011 | Krauss et al. |
| 2011/0049442 | A1 | 3/2011 | Schreuder et al. |
| 2011/0052918 | A1 | 3/2011 | Krauss et al. |
| 2011/0080090 | A1 | 4/2011 | Wood et al. |
| 2011/0081538 | A1 | 4/2011 | Linton |
| 2011/0103055 | A1 | 5/2011 | Carroll |
| 2011/0103064 | A1 | 5/2011 | Coe-Sullivan et al. |
| 2011/0129420 | A1 | 6/2011 | Allen et al. |
| 2011/0175030 | A1 | 7/2011 | Ren et al. |
| 2011/0186811 | A1 | 8/2011 | Coe-Sullivan et al. |
| 2011/0212561 | A1 | 9/2011 | Banin et al. |
| 2011/0220194 | A1* | 9/2011 | Kurtin ............ H01L 31/055 136/256 |
| 2011/0220844 | A1 | 9/2011 | Tulsky et al. |
| 2011/0223110 | A1 | 9/2011 | Bartel et al. |
| 2011/0223425 | A1 | 9/2011 | Schreuder et al. |

(56) References Cited

U.S. PATENT DOCUMENTS

| | | |
|---|---|---|
| 2011/0226991 A1 | 9/2011 | Treadway et al. |
| 2011/0229397 A1 | 9/2011 | Bartel et al. |
| 2011/0233468 A1 | 9/2011 | Zong et al. |
| 2011/0245533 A1 | 10/2011 | Breen et al. |
| 2011/0260111 A1 | 10/2011 | Nie et al. |
| 2011/0262752 A1 | 10/2011 | Bawendi et al. |
| 2011/0278536 A1 | 11/2011 | Walker et al. |
| 2011/0309238 A1 | 12/2011 | Tian et al. |
| 2011/0309325 A1 | 12/2011 | Park et al. |
| 2012/0018675 A1 | 1/2012 | Okuyama et al. |
| 2012/0049119 A1 | 3/2012 | Greytak et al. |
| 2012/0113671 A1 | 5/2012 | Sadasivan et al. |
| 2012/0175588 A1 | 7/2012 | Qiao et al. |
| 2012/0187367 A1 | 7/2012 | Modi et al. |
| 2012/0189791 A1 | 7/2012 | Modi et al. |
| 2012/0250351 A1 | 10/2012 | Shin et al. |
| 2012/0256141 A1 | 10/2012 | Nick et al. |
| 2012/0286238 A1 | 11/2012 | Linton et al. |
| 2012/0313075 A1 | 12/2012 | Linton et al. |
| 2013/0026506 A1 | 1/2013 | Arbell |
| 2013/0048946 A1 | 2/2013 | Jang et al. |
| 2013/0069018 A1 | 3/2013 | Zhu et al. |
| 2013/0092886 A1 | 4/2013 | Kahen et al. |
| 2013/0148376 A1 | 6/2013 | Nick et al. |
| 2013/0169904 A1 | 7/2013 | Kang et al. |
| 2013/0175514 A1 | 7/2013 | Han et al. |
| 2013/0240787 A1 | 9/2013 | Chen et al. |
| 2013/0273247 A1 | 10/2013 | Kamplain et al. |
| 2014/0001436 A1 | 1/2014 | Welch et al. |
| 2014/0049155 A1 | 2/2014 | Kurtin |
| 2014/0175591 A1 | 6/2014 | Tian et al. |
| 2014/0198142 A1 | 7/2014 | Whitehead et al. |
| 2014/0227862 A1 | 8/2014 | Song et al. |
| 2014/0284549 A1 | 9/2014 | Liu et al. |
| 2014/0312300 A1 | 10/2014 | Ramprasad et al. |
| 2014/0322901 A1 | 10/2014 | Huang et al. |
| 2014/0334181 A1 | 11/2014 | Hu et al. |
| 2015/0003043 A1 | 1/2015 | Ke |
| 2015/0013589 A1 | 1/2015 | Liu et al. |
| 2015/0014586 A1 | 1/2015 | Liu et al. |
| 2015/0014629 A1 | 1/2015 | Breen et al. |
| 2015/0021521 A1 | 1/2015 | Nick et al. |
| 2015/0021548 A1 | 1/2015 | Liu et al. |
| 2015/0021551 A1 | 1/2015 | Breen et al. |
| 2015/0152324 A1 | 6/2015 | Breen et al. |
| 2015/0166341 A1 | 6/2015 | Hamilton et al. |
| 2015/0171268 A1 | 6/2015 | Breen et al. |
| 2015/0184074 A1 | 7/2015 | Breen et al. |
| 2016/0155882 A1 | 6/2016 | Tian et al. |

FOREIGN PATENT DOCUMENTS

| | | |
|---|---|---|
| TW | 200918449 A | 5/2009 |
| WO | 2008063658 A2 | 5/2008 |
| WO | 2009014590 A2 | 1/2009 |
| WO | 2009120688 A1 | 10/2009 |
| WO | 2009137053 A1 | 11/2009 |
| WO | 2009145813 A1 | 12/2009 |
| WO | 2009151515 A1 | 12/2009 |
| WO | 2010129350 A2 | 11/2010 |
| WO | 2010129374 A2 | 11/2010 |
| WO | 2011031871 A1 | 3/2011 |
| WO | 2012021643 A2 | 2/2012 |
| WO | 2013078242 A1 | 5/2013 |
| WO | 2013078245 A1 | 5/2013 |
| WO | 2013078247 A1 | 5/2013 |
| WO | 2013078249 A1 | 5/2013 |
| WO | 2013078251 A1 | 5/2013 |
| WO | 2013078252 A1 | 5/2013 |
| WO | 2013115898 A2 | 8/2013 |
| WO | 2013162646 A1 | 10/2013 |

OTHER PUBLICATIONS

Taiwanese Office Action for Taiwanese Patent Application No. 101143543 dated Oct. 3, 2016.

Chinese Office Action—CN Application No. 201280072253.9 dated Feb. 17, 2017.

U.S. Office Action—U.S. Appl. No. 14/284,265 dated Mar. 6, 2017, citing US2007/0201056.

U.S. Office Action—U.S. Appl. No. 14/451,125 dated Apr. 13, 2017, citing US20140001436 and US20130026506.

Zhou, P., et al., "Temperature-dependent photoluminescence properties of Mn:ZnCuInS nanocrystals", Optical Materials Express (2015), vol. 5, No. 9, (12 pgs).

Bachmann, V., et al., "Temperature Quenching of Yellow Ce3+ Luminescence in YAG:Ce", Chem. Mater., (2009), vol. 21, pp. 2077-2084.

Chang, Y., et al., "Synthesis and Photoluminescence Charateristics of High Color Purity and Brightness Li3Ba2Gd3 (M0O4)8:Eu3+ Red Phosphors", J. Phys. Chem. C, (2010), vol. 114, pp. 3645-3652.

Chinese Office Action dated Apr. 22, 2016 in CN Application No. 2012800722539, which is the Chinese counterpart of related U.S. Appl. No. 14/451,125.

Chinese Search Report dated Apr. 13, 2016 in CN Application No. 2012800722539, which is the Chinese counterpart of related U.S. Appl. No. 14/451,125.

Cumberland, S., et al., "Inorganic Clusters as Single-Source Precursors for Preparation of CdSe, ZnSe, and CdSe/ZnS Nanomaterials" Chem. Mater. (2002), vol. 14, pp. 1576-1584.

Dabbousi, B., et al., "(CdSe) ZnS Core-Shell Quantum Dots: Synthesis and Characterization of a Size Series of Highly Luminescent Nanocrystallites", J, Phys. Chem. 101, pp. 9463-9475, 1997.

De Mello, J., et al., "An Improved Experimental Determination of External Photoluminescence Quantum Efficiency", VCH Verlagsgesellschaft mbH, D-69469 Weinheim, Adv. Mater. 1997, vol. 9(3), pp. 230-232.

Dukes, A., et al., "Luminescent Quantum Dots", ECS Transactions (2011), vol. 33, pp. 3-16.

Gindele, F., et al., "Phonon interaction of single excitons and biexcitons", Phys. Rev. B (1999), vol. 60, No. 4, Jul. 15, 1999-II, 4 Pages, The American Physical Society.

Gong, K., "Synthesis, optical properties, and surface modification of magic-size semiconductor nanocrystals, nanowires and nanop!atelets", Theses and Dissertations, San Diego State University, Sep. 12, 2011, 49 Pages. <http://sdsu-dspace.calstate,edu/handle/10211.10/1438>.

Hines, M., et al., "Synthesis and Characterization of Strongly Luminescing ZnS-Capped CdSe Nanocrystals" J. Phys. Chem., vol. 100, No. 2, 1996, pp. 468-471, American Chemical Society.

Jiao, Y., et al, "Measurement and Analysis of Temperature-Dependent Optical Modal Gain in Single-Layer InAs/InP (I00) Quantum-Dot Amplifiers in the 1.6-to 1.8-µm Wavelength Range", IEEE Photonics Journal, Temperature-Dependent Optical Modal Gain, vol. 4, No. 6, Dec. 2012, pp. 2292-2306.

Jing, P., et al., "Temperature-Dependent Photoluminescence of CdSe-Core CdS/CdZnS/ZnS-Multishell Quantum Dots", J. Phys. Chem C ( 2009), vol. 113, pp. 13545-13550.

Kim, S., "Assembly and Control of Light-Emitting Nanostructures for Near-Field Imaging", Process & Characterization, 2008 NNIN REU Research Accomplishments, pp. 136-137.

Koole, R., et al., "Paramagnetic lipid-coated silica nanoparticles with a fluorescent quantum dot core: a new contrast agent platform for multimodality imaging", NIH Public Access, Author Manuscript, Bioconjugate Chemistry Dec. 2008; 19(12), pp. 2471-2479.

Lu, T., et al., "Temperature-dependent photoluminescence in light-emitting diodes", Aug. 20, 2014, Scientific Reports 4:6131, pp. 1-7. www.nature.com/scientificreports.

Morello, G., et al., "Temperature and Size Dependence of Nonradiative Relaxation and Exciton-Phonon Coupling in Colloidal CdTe Quantum Dots", Articles, J. Phys. Chem C 2007, 111, pp. 5846-5849, American Chemical Society, Published on Web Apr. 3, 2007.

Murray, C., et al., "Synthesis and Characterization of Monodisperse Nanocrystals and Close-Packed Nanocrystal Assemblies", Annu. Rev. Mater. Sci. 2000. 30, pp. 545-610, American Chemical Society.

(56) References Cited

OTHER PUBLICATIONS

Murray, C., et al., "Synthesis and Characterization of Nearly Monodisperse CdE (E=S, Se, Te) Semiconductor Nanocrystallites", J. Am. Chem. Soc., vol. 115, No. 19, 1993, pp. 8706-8715.

Murray C. "Synthesis and Characterization of II-VI Quantum Dots and Their Assembly into 3D Quantum Dot Superlattices", Massachusetts Institute of Technology, Sep. 1995, 166 Pages.

LED professional, "Nexxus Lighting Delivers First Commercially-Available Quantum Dot-LED Replacement Light Bulbs", Mar. 12, 2010, 3 Pages. URL: <http://www.led-professional.com/products/led-lamps/nexxus-lighting-delivers-first-commercially-available-quantum-dot-led-replacement-light-bulbs>.

PCT International Search Report dated Feb. 4, 2013 in International Application No. PCT/US2012/066158, Filed Nov. 20, 2012.

PCT International Search Report dated Feb. 5, 2013 in International Application No. PCT/US2012/066145, Filed Nov. 20, 2012.

PCT International Search Report dated Mar. 25, 2013 in International Application No. PCT/US2012/066154, Filed Nov. 20, 2012.

Peng, et al., "Formation of High-Quality CdTe, CdSe, and CdS Nanocrystals Using CdO as Precursor", J. Am. Chem. Soc. (2001), vol. 123, pp. 183-184.

Peng, Z., et al., "Mechanisms of the Shape Evolution of CdSe Nanocrystals", J. Am, Chem. Soc. (2001) vol. 123, pp. 1389-1395.

QLED Technology. QD Vision, Oct. 18, 2010, retrieved from the Internet, 5 Pages. <http://web.archive.org/web/201018132134/http://www.qdvision.com/qled-technology>.

Qu, et al., "Alternative Routes Toward High Quality CdSe Nanocrystals", Nano Lett. (2001), vol. 1, No. 6, pp. 333-337.

LEDs Magazine, "Quantum Dots begin to impact backlight and general illumination applications". LEDs Magazine, Feb. 9, 2010, 3 Pages. <http://ledsmagazine.com/news/7/2/12>.

Reiss, P., et al., "Core/Shell Semiconductor Nanocrystals" small (2009), vol. 5, No. 2, pp. 154-168.

Seravalli, L., et al., "Quantum dot strain engineering for light emission at 1.3, 1.4 and 1.5 μm" Appl. Phys. Lett. (2005), vol. 87, 063101 (3pp).

Valerini, D., et al., "Temperature dependence of the photoluminescence properties of colloidal CdSe/ZnS core/shell quantum dots embedded in a polystyrene matrix" Phys. Rev. B (2005), vol. 71, 235409, 6 Pages.

Wang, X., et al., "Temperature dependent photoluminescence investigation of AlGaAs/GaAs quantum wires grown by flow rate modulation epitaxy", Appl. Phys. Lett. (1995), vol. 67, No. 24, pp. 3629-3631.

Woo, J., et al., "Thermal behavior of a quantum dot nanocomposite as a color converting material and its application to white LED" Nanotechnology (2010), vol. 21, No. 49, 495704, 8 Pages.

Zhao, W., et al., "Temperature Dependence of Emission Properties of Self-Assembled inGaN Quantum Dots", Chin. Phys. Leti., vol. 31, No. 11 (2014) 114205, 4 Pages.

Aharoni et al., "Synthesis of InAs/CdSe/ZnSe Core/Shell1/SHell2 Structures with bright and stable Near-Infrared Flourescence"; J. AM. Chem. Soc.; 2006; 128; 257-264.

Aydin, et al., "Colloidal Synthesis And Characterization Of Cdse Quantum Dots: Role of Cd:Se Molar Ratio And Temperature", IJSTR (2016), vol. 5, No. 01; pp. 66-70.

Bala et al., "Interaction of Different Metal Ions with Carboxylic Acid Group: A Quantative Study"; J. Phys/ Chem. A; 2007; 111; 6183-6190.

Cyntec Industries Inc., "Cyanex® 921 Extractant" brochure, 2008 (16 pages).

Donega et al., "Physicochemical Evaluation of the Hot-Injection Method, a Synthesis Route for Monodisperse Nanocrystals"; Small; 2005; 1; No. 12; 1152-1162.

Dukes, III, et al., "Synthesis of Magic-Sized CdSe and CdTe Nanocrystals with Diisooctylphosphinic Acid" Chem. Mater., 2010, vol. 22; pp. 6402-6408.

Evans et al., "Mysteries of TOPSe Revealed: Insight into Quantum Dot Nucleation"; J. AM. Chem. Soc.; 2010; vol. 132 (32) (3 pages).

Evans et al., Supporting Documents for: "Mysteries of TOPSe Revealed: Insights into Quantum Dot Nucleation"; vol. 132, (32) (21 pages).

Final Office Action dated Oct. 20, 2017 in PNK1539USC.

Gomes et al., "Binding of Phosphonic Acids to CdSe Quantum Dots: A Solution NMR Study"; J. Phys. Chem. Lett.; 2011; 2; 145-152.

International Search Report dated Feb. 5, 2013; International Application No. PCT/US2012/066145; International Filing Date Nov. 20, 2012 (5 pages).

International Search Report dated Feb. 8, 2013; International Application No. PCT/US12/66140; International Filing Date Nov. 20, 2012 (2 pages).

Jang et al., "High quality CdSeS nanocrystals synthesized by facile single injection process and their electroluminescence"; ChemComm; 2003; 2964-2965.

Kopping et al., "Identification of Acidic Phosphorus-Containing Ligands Involved in the Surface Chemistry of CdSe Nanoparticles Prepared in Tri-N-octylphosphine Oxide Solvents"; J. AM. Chem. Soc. 2008; 130; 5689-5698.

Kopping et al., Supporting Documents for: "Identification of Acidic Phosphorous-Containing Ligands Involved in the Surface Chemistry of CdSe Nanoparticles Prepared in Tri-n-Octylphosphine Oxide (TOPO) Solvents" (5 pages).

Kortan et al., " Nucleation and Growth of CdSe on ZnS Quantum Crystallite Seeds, and Vice Versa, in Inverse Micelle Media"; J. Am. Chem. Soc.; 1990; vol. 112 No. 4; 1327-1332.

Lorenz et al., "Surfactant—Semiconductor Interfaces: Perturbation of the Photoluminescence of Bulk Cadmium Selenide by Adsorption of Tri-n-octylphosphine Oxide as a Probe of Solution Aggregation v Relevance to Nanocrystals Stabilization", J. Am Chem. Soc., (1998), vol. 120, pp. 10970-10975.

Owen et al., "Precursor Conversion Kinetics and the Nucleation of Cadmium Selenide Nanocrystals"; J. AM. Chem. Soc.; 2010; 132; 18206-18213.

Owen et al., Supporting Documents for: "Precursor conversion kinetics and the nucleation of cadmium selenide nanocrystals" (13 pages).

Peng et al., "Kinetics of II-VI and III-V Colloidal Semiconductor Nanocrystal Growth: "Focusing" of Size Distributions"; J. Am. Chem. Soc.; 1998; 120; 5343-5344.

Pietryga, et al., "Utilizing the Lability of Lead Selenide to Produce Heterostructured Nanocrystals with Bright, Stable Infrared Emission", J. Am. Chem. Soc., 2008, vol. 130; pp. 4879-4885.

Puzder et al., "The Effect of Organic Ligand Binding on the Growth CdSe Nanoparticles Probed by Ab-Initio Calculations"; Nanoletters; 2004; vol. 4, No. 12; 1-6.

Reiss et al., "The Growth of Uniform Colloidal Dispersion"; Journal of Chemical Physics; 1951; vol. 19; No. 4; 482-487.

Schreuder et al., "Control of Surface State Emission via Phosphonic Acid Modulation in Ultrasmall CdSe Nanocrystals: The Role of Ligand Electronegativity"; J. Phys. Chem. C.; 2009; 113; 8169-8176.

Shen et al., "One-Step Synthesis of White-Light-Emitting Quantum Dots at Low Temperature"; Inorg. Chem.; 2009; 48; 8689-8694.

Steckel, J. S., Thesis entitled: "The Synthesis of Inorganic Semiconductor Nanocrystalline Materials For the Purpose of Creating Hybrid Organic/Inorganic Light-Emitting Devices", Massachusetts Institute of Technology, Sep. 2006.

Talapin, et al., "Highly Luminescent Monodisperse CdSe and CdSe/ZnS Nanocrystals Synthesized in a Hexadecylamine-Trioctylphosphine Oxide-Trioctylphospine Mixture", Nano Letters, 2001, vol. 1, No. 4; pp. 207-211.

Wang et al., "Morphology Control of Cadmium Selenide Nanocrystals: Insights into the Roles of Di-n-octylphosphine Oxide (DOPO) and Di-n-octylphosphinic Acid (DOPA)"; J. Am. Chem. Soc.; 2012; 134; 5369-5380.

Wang et al., "Spectroscopic Identification of Tri-n-octylphosphine Oxide (TOPO) Impurities and Elucidation of Their Roles in Cadmium Selenide Quantum-Wire Growth"; J. Am. Chem. Soc.; 2009; 131; 4983-4994.

(56) References Cited

OTHER PUBLICATIONS

Wang et al., "The Trouble with TOPO; Identification of Adventitious Impurities Beneficial to the Growth of Cadmium Selenide Quantum Dots, Rods, and Wires"; Nano Letters; 2008.
Wang et al., Supporting Documents for: "Morphology Control of Cadmiun Selenide Nanocrystals: Insight into the Roles of Di-n-octylphosphine Oxide (DOPO) and Di-n-octylphosphinic Acid (DOPA)" (37 pages).
Wang et al., Supporting Documents for: "Spectoscopic Identification of Tri-n-octylphosphine Oxide (TOPO) Impurities and Elucidation of Their Roles in Cadmium Selenide Quantum-Wire Growth" (49 pages).
Wang et al., Supporting Documents for: The Trouble with TOPO; Identification of Adventitious Impurities Beneficial to the Growth of Cadmium Selenide Quantum Dots, Rods and Wires (7 pages).
Wolcott et al., "CdSe Quantum Rod Formation Aided by in Situ TOPO Oxidation"; Chem. Mater.; 2010; 22; 2814-2821.
Wolcott et al., Supporting Documents for: "CdSe Quantum Rod Formation Aided by in Situ TOPO Qxidation" (10 pages).
Written Opinion dated Feb. 5, 2013; International Application No. PCT/US2012/066145; International Filing Date Nov. 20, 2012 (15 pages).
Written Opinion dated Feb. 8, 2013; International Application No. PCT/US12/66140; International Filing Date Nov. 20, 2012 (6 pages).
Xie et al., "Synthesis and Characterization of Highly Luminescent CdSe-Core CdS/Zn0.5Cd0.5S/ZnS Multishell Nanocrystals"; J. Am. Chem. Soc.; 2005; 127; 7480-7488.
Taiwanese Office Action for Application No. 101143545 dated Dec. 22, 2017.

\* cited by examiner

Absorption spectrum of the CdSe core of Example III
(596nm peak, 12nm HWHM).

Absorption and emission spectrum of CdSe/ZnSe/CdZnS of Example III
(Emission Peak: 605nm; FWHM 25nm)

Absorption spectrum of the CdSe core material of Example IV (559nm peak, 13nm HWHM).

Absorption and emission spectrum of CdSe/ZnS/CdZnS of Example IV (Emission Peak: 598nm; FWHM 24nm)

COATED SEMICONDUCTOR NANOCRYSTALS AND PRODUCTS INCLUDING SAME

This application is a continuation of International Application No. PCT/US2012/066158, filed 20 Nov. 2012, which was published in the English language as International Publication No. WO 2013/162646 A1 on 31 Oct. 2013, which International Application claims priority to U.S. Provisional Patent Application No. 61/636,702, filed on Apr. 22, 2012. Each of the foregoing is hereby incorporated herein by reference in its entirety for all purposes.

This application is also a continuation-in-part of U.S. patent application Ser. No. 14/451,125 filed 4 Aug. 2014, which is a continuation of International Application No. PCT/US2012/066154, filed 20 Nov. 2012, which International Application claims priority to U.S. Provisional Patent Application No. 61/595,116, filed on 5 Feb. 2012 and U.S. Provisional Patent Application No. 61/678,902, filed on 2 Aug. 2012.

This application is also a continuation-in-part of U.S. application Ser. No. 14/284,265, filed 21 May 2014, which is a continuation of International Application No. PCT/US2012/066145, filed 20 Nov. 2012, which International Application claims priority to U.S. Provisional Patent Application No. 61/562,463, filed on 22 Nov. 2011, U.S. Provisional Patent Application No. 61/636,701, filed on 22 Apr. 2012, and U.S. Provisional Patent Application No. 61/678,883, filed on 2 Aug. 2012.

TECHNICAL FIELD OF THE INVENTION

The present invention relate to semiconductor nanocrystals, also referred to as quantum dots, including a coating or layer thereover and products including same.

SUMMARY OF THE INVENTION

The present invention relates to quantum dots including an overcoating, materials and products including quantum dots taught herein, and materials and products including quantum dots made by a method taught herein.

In accordance with one aspect of the present invention, there is provided a quantum dot including a core quantum dot and at least one semiconductor shell wherein the quantum dot is substantially free of an amine species, wherein the quantum dot is characterized by having a solid state photoluminescence external quantum efficiency at a temperature of 90° C. or above that is at least 95% of the solid state photoluminescence external quantum efficiency of the semiconductor nanocrystal at 25° C.

In certain embodiments, the quantum dot is characterized by having solid state photoluminescence external quantum efficiency at a temperature of 90° C. or above that is at least 95% of the solid state photoluminescence external quantum efficiency of the semiconductor nanocrystal at 25° C. In certain embodiments, the temperature of 90° C. or above is above 100° C. In certain embodiments the temperature is in a range, for example, from 90° C. to about 200° C., from 90° C. to about 140° C., from 90° C. to about 120° C., or from 90° C. to about 100° C.

In certain embodiments, the quantum dot is characterized by having a solid state photoluminescence efficiency at the temperature of 90° C. or above that is from 95 to 100% of the solid state photoluminescence efficiency at 25° C.

In accordance with another aspect of the present invention, there is provided a quantum dot including a core particle having a first coating or layer or shell comprising zinc chalcogenide (e.g., zinc sulfide, zinc selenide, or other zinc chalcogenide, or a mixture including at least one of the foregoing) on an outer surface of the core particle, and a second coating comprising a semiconductor material disposed over the first coating wherein the second coating is substantially free of amine species, wherein the quantum dot is characterized by having a solid state photoluminescence external quantum efficiency at a temperature of 90° C. or above that is at least 95% of the solid state photoluminescence external quantum efficiency of the semiconductor nanocrystal at 25° C.

In certain embodiments, the first coating, layer or shell on a core particle is substantially free of amine species.

In certain embodiments, the coating, layer or shell on a core particle is substantially free of amine species at the surface of the coating, layer or shell whether the amine species is free, unreacted or unbound or as bound ligands.

In certain embodiments, the quantum dot is characterized by having solid state photoluminescence external quantum efficiency at a temperature of 90° C. or above that is at least 95% of the solid state photoluminescence external quantum efficiency of the semiconductor nanocrystal at 25° C. In certain embodiments, the temperature of 90° C. or above is above 100° C. In certain embodiments the temperature is in a range, for example, from 90° C. to about 200° C., from 90° C. to about 140° C., from 90° C. to about 120° C., or from 90° C. to about 100° C.

In certain embodiments, the quantum dot is characterized by having a solid state photoluminescence efficiency at the temperature of 90° C. or above that is from 95 to 100% of the solid state photoluminescence efficiency at 25° C.

In accordance with another aspect of the present invention, there are provided quantum dots comprising a quantum dot core with a first coating comprising zinc chalcogenide on an outer surface of the quantum dot core and an outermost coating comprising a semiconductor material, wherein the outermost coating is substantially free of amine species, wherein the quantum dots are characterized by having a solid state photoluminescence external quantum efficiency at a temperature of 90° C. or above that is at least 95% of the solid state photoluminescence external quantum efficiency of the semiconductor nanocrystal at 25° C.

In certain embodiments, the first coating, layer or shell on a core particle is substantially free of amine species.

In certain embodiments, the coating, layer or shell on a core particle is substantially free of amine species at the surface of the coating, layer or shell whether the amine species is free, unreacted or unbound or as bound ligands.

In certain embodiments, the quantum dot is characterized by having solid state photoluminescence external quantum efficiency at a temperature of 90° C. or above that is at least 95% of the solid state photoluminescence external quantum efficiency of the semiconductor nanocrystal at 25° C. In certain embodiments, the temperature of 90° C. or above is above 100° C. In certain embodiments the temperature is in a range, for example, from 90° C. to about 200° C., from 90° C. to about 140° C., from 90° C. to about 120° C., or from 90° C. to about 100° C.

In certain embodiments, the quantum dot is characterized by having a solid state photoluminescence efficiency at the temperature of 90° C. or above that is from 95 to 100% of the solid state photoluminescence efficiency at 25° C.

In applications where quantum dots are included or embedded within a host material (e.g., a matrix), and in which the quantum dot—host material system which will be subjected to light flux, e.g., in excess of 1 W/cm², discoloration of the host material can be accelerated when the matrix is at a temperature ≥100° C. While not wishing to be bound by theory, the presence of amines is believed to increase the probability of unwanted photochemistry at such light flux levels which can result in discoloration of the host material. In addition, the curing mechanism of for example, some silicone matrices using a Pt catalyst can be deactivated by the presence of amines. Accordingly, one aspect of the present invention is to synthesize quantum dots that are substantially free of amine species in either the core particle or coating or layer or shell or both.

In certain embodiments, the absence or substantial absence of amine species in the coating or layering or shelling process of quantum dots advantageously reduces, inhibits or lowers yellowing, browning or discoloration of a matrix including such quantum dots when the matrix is placed under light flux conditions, e.g., in excess of 1 W/cm$^2$, which discoloration can be accelerated when the matrix is at a temperature ≥100° C.

According to an additional aspect, the absence or substantial absence of amine species in the core particles whether as bound ligands or as free, unreacted or unbound amine species prior to providing a coating or layer or shell on the core quantum dots and where the reactants producing the coating or layer or shell do not include amine species results in quantum dot particles lacking or substantially lacking amine species. Such particles, when used in a matrix under light flux conditions, e.g., in excess of 1 W/cm$^2$ and/or temperature conditions ≥100° C., for example, advantageously inhibit, reduce or lower yellowing, browning or discoloration of the quantum dot matrix. Accordingly, certain aspects of the present invention are directed to quantum dot particles which lack or substantially lack amine species that otherwise would result in discoloration or yellowing or browning when used in a matrix under light flux conditions, e.g., in excess of 1 W/cm$^2$, which discoloration can be accelerated when the matrix is at a temperature ≥100° C.

In certain embodiments, a quantum dot described herein can be prepared by a method comprising forming one or more coatings or layers or shells on quantum dots wherein amine species are not present or are not substantially present during formation of at least the outermost coating or layer or shell on core quantum dots.

Preferably, one or more of the coatings or layers or shells are formed at a high temperature (e.g., >240° C.).

A quantum dot that is coated by a method taught herein may also be referred to as a "core" particle or a "core" quantum dot.

In certain embodiments, the core particle on which a coating or layer or shell is to be formed is substantially free of amine species.

In certain embodiments including a core quantum dot including an amine species, the amine species can be removed or substantially removed from the core quantum dots prior to providing a coating or layer or shell on the core quantum dots, whether the reactants producing the coating or layer or shell do or do not include amine species.

In certain embodiments, a quantum dot described herein can be prepared by a method comprising providing two or more coatings on a quantum dot, the method comprising forming a first coating or layer or shell comprising zinc chalcogenide on a quantum dot core to form first coated quantum dots, and forming a second coating comprising a semiconductor material on first coated quantum dots, wherein the second coating is formed in the substantial absence of amine species.

In certain embodiments, the first coating is formed in the substantial absence of amine species.

A shell comprising zinc chalcogenide can comprise zinc sulfide, zinc selenide, or other zinc chalcogenide, or a mixture including at least one of the foregoing.

Preferably, one or more of the coatings or layers or shells are formed at a high temperature (e.g., >240° C.).

In one example, the method comprises providing a first reaction mixture including core quantum dots, a zinc carboxylate and one or more chalcogen sources at a temperature of greater than 240° C., preferably greater than 280° C.; forming a first coating from the zinc carboxylate and one or more chalcogen sources on at least a portion of the core quantum dots to form first coated quantum dots; forming a second reaction mixture comprising one or more metal carboxylates, one or more chalcogen sources, and first coated quantum dots at a temperature of greater than 240° C., preferably greater than 280° C., in the substantial absence of an amine species; and forming a second coating on the first coated quantum dots from one or metal carboxylate(s) and one or more chalcogen sources.

Preferably, the first coating comprising one or more zinc chalcogens is formed in the substantial absence of an amine species.

In certain embodiments, the second coating comprises $Cd_xZn_{1-x}S$ wherein $0 \leq x \leq 1$.

In certain embodiments of the method wherein the second coating comprises $Cd_xZn_{1-x}S$ wherein $0 \leq x \leq 1$, the total molar equivalents of chalcogen included in the one more chalcogen sources included in the second reaction mixture and total molar equivalents of metal included in the one or more metal carboxylate sources included in the second reaction mixture are included in a ratio of total molar equivalents of chalcogen to total molar equivalents of metal in a range from greater than 1 to 4.

In one example, the method comprises providing a first reaction mixture including core quantum dots, a zinc carboxylate and a sulfur source at a temperature of greater than 240° C., preferably greater than 280° C.; forming a first coating from the zinc carboxylate and sulfur source on at least a portion of the core quantum dots to form first coated quantum dots; forming a second reaction mixture comprising one or more metal carboxylates, one or more chalcogen sources, and first coated quantum dots at a temperature of greater than 240° C., preferably greater than 280° C., in the substantial absence of an amine species; and forming a second coating on the first coated quantum dots from one or more metal carboxylate(s) and one or more chalcogen sources.

Preferably, the first coating comprising zinc sulfide is formed in the substantial absence of an amine species.

In another example, the method comprises providing a first reaction mixture including core quantum dots, a zinc carboxylate and a selenium source at a temperature of greater than 300° C., preferably greater than 310° C.; forming a first coating from the zinc carboxylate and selenium source on at least a portion of the core quantum dots to form first coated quantum dots; forming a second reaction mixture comprising one or more metal carboxylates, one or more chalcogen sources, and first coated quantum dots at a temperature of greater than 240° C., preferably greater than 280° C., in the substantial absence of an amine species; and forming a second coating on the first coated quantum dots from one or more metal carboxylate(s) and one or more chalcogen sources.

Preferably, the first coating comprising zinc selenide is formed in the substantial absence of an amine species.

In certain embodiments, the core particle on which a coating or layer or shell is to be formed is substantially free of amine species.

In certain embodiments including a core quantum dot including an amine species, the amine species can be removed or substantially removed from the core quantum dots prior to providing a coating or layer or shell on the core quantum dots, whether the reactants producing the coating or layer or shell do or do not include amine species.

Exemplary methods of providing a core quantum dot with one or more coatings, layers or shells are described herein. Exemplary methods of providing a core quantum dot with one or more coatings, layers or shells are known to those of skill in the art. In an exemplary embodiment, a high temperature overcoating process is a process where a coating or layer or shell is provided on the surface of a core quantum dot at a temperature of greater than 240° C., greater than 250° C., greater than 260° C., greater than 270° C., greater than 280° C., greater than 290° C., greater than 300° C., greater than 310° C., or greater than 320° C.

According to certain aspects, a core quantum dot may be provided with one or more coatings or layers or shells of a same or different material. Selection of the materials for the one or more coatings or layers or shells of the same or different material may be made to alter the emitting characteristics of the resulting core-shell quantum dot. According to an additional aspect, a coating process is provided which lacks or substantially lacks an amine species. According to this aspect, materials are selected which can be used to coat a core quantum dot particle in the absence or substantial absence of an amine species. According to this aspect, a reaction mixture of core quantum dot particles and coating reactants is provided which lacks an amine species. According to an additional aspect, a method of making core-shell quantum dots is provided which lacks an amine species in the reaction mixture used to form one or more coatings, layers or shells on core quantum dot particles. The absence or substantial absence of an amine species during the coating process produces core-shell quantum dots which when used in a matrix under light flux, e.g., in excess of 1 W/cm$^2$ and/or temperature conditions ≥100° C., inhibit, reduce or lower discoloring or yellowing or browning.

Embodiments of the present invention are further directed to methods of increasing, improving or enhancing emission of quantum dots or otherwise increasing, improving or enhancing the lifetime of quantum dots. According to certain aspects, quantum dots are provided which lack or substantially lack amine species at least at the outer surface thereof. Core quantum dots are coated using a procedure which lacks amine species to result in core-shell quantum dots having increased, improved or enhanced emission and/or an increased, improved or enhanced lifetime. According to an additional aspect, materials for one or more coatings or layers or shells are selected. A core quantum dot particle is provided with one or more coatings or layers or shells of a same or different material in the absence or substantial absence of an amine species to result in core-shell quantum dots having increased, improved or enhanced emission.

In certain embodiments, quantum dots taught herein can have a solid state EQE of at least 90%.

The core-shell quantum dots of the present invention may be present, for example, in a matrix or host material and placed in capillaries which are used, for example, in back light units. The quantum dots may also be used in films or solid state lighting applications or in any application utilizing quantum dots, such as direct on-chip semiconductor LED applications, electroluminescent applications such as QLEDs, solar applications such as photovoltaic cells and concentrators, and diagnostic and medical applications such as labeling, imaging and the like.

In accordance with a still further aspect of the present invention, there is provided a composition including at least one quantum dot described herein. In certain embodiments of the composition, the solid state photoluminescence efficiency of the composition is at least 80% at a temperature of 90° C. or above. In certain embodiments of the composition, the solid state photoluminescence efficiency of the composition at a temperature of 90° C. or above is at least 95% of the solid state photoluminescence efficiency of the composition at 25° C. In certain embodiments, the temperature of 90° C. or above is above 100° C. In certain embodiments the temperature is in a range, for example, from 90° C. to about 200° C., from 90° C. to about 140° C., from 90° C. to about 120° C., or from 90° C. to about 100° C.

In certain embodiments, the composition further includes a host material.

In accordance with a still further aspect of the present invention, there is provided an optical material comprising at least one quantum dot described herein.

In accordance with a still further aspect of the present invention, there is provided a light emitting material comprising at least one quantum dot described herein.

In accordance with a still further aspect of the present invention, there is provided an optical component including at least one quantum dot described herein.

In accordance with a still further aspect of the present invention, there is provided a backlighting unit including at least one quantum dot described herein.

In accordance with a still further aspect of the present invention, there is provided a display including at least one quantum dot described herein.

In accordance with a still further aspect of the present invention, there is provided an electronic device including at least one quantum dot described herein.

In accordance with a still further aspect of the present invention, there is provided an opto-electronic device including at least one quantum dot described herein.

In accordance with a still further aspect of the present invention, there is provided a light-emitting device including at least one quantum dot described herein.

In accordance with a still further aspect of the present invention, there is provided a lamp including at least one quantum dot described herein.

In accordance with a still further aspect of the present invention, there is provided a light bulb including at least one quantum dot described herein.

In accordance with a still further aspect of the present invention, there is provided a luminaire including at least one quantum dot described herein.

In accordance with yet another aspect of the present invention, there is provided a population of quantum dots including at least on quantum dot described herein. In certain embodiments, the light emitted by the population has a peak emission at a predetermined wavelength with an FWHM less than about 60 nm. In certain embodiments, the FWHM is in a range from about 15 to about 50 nm.

In accordance with yet another aspect of the present invention, there is provided a population of quantum dots prepared in accordance with any of the methods described herein. In certain embodiments, the light emitted by the population has a peak emission at a predetermined wavelength with an FWHM less than about 60 nm. In certain embodiments, the FWHM is in a range from about 15 to about 50 nm.

In accordance with a still further aspect of the present invention, there is provided a composition including at least one quantum dot prepared in accordance with any of the methods described herein. In certain embodiments of the composition, the solid state photoluminescence efficiency of the composition is at least 80% at a temperature of 90° C. or above. In certain embodiments of the composition, the solid state photoluminescence efficiency of the composition at a temperature of 90° C. or above is at least 95% of the solid state photoluminescence efficiency of the composition at 25° C. In certain embodiments, the composition further includes a host material.

In accordance with a still further aspect of the present invention, there is provided an optical material comprising at least one quantum dot prepared in accordance with any of the methods described herein.

In accordance with a still further aspect of the present invention, there is provided a light emitting material comprising at least one quantum dot prepared in accordance with any of the methods described herein.

In accordance with a still further aspect of the present invention, there is provided an optical component including at least one quantum dot prepared in accordance with any of the methods described herein.

In accordance with a still further aspect of the present invention, there is provided a backlighting unit including at least one quantum dot prepared in accordance with any of the methods described herein.

In accordance with a still further aspect of the present invention, there is provided a display including at least one quantum dot prepared in accordance with any of the methods described herein.

In accordance with a still further aspect of the present invention, there is provided an electronic device including at least one quantum dot prepared in accordance with any of the methods described herein.

In accordance with a still further aspect of the present invention, there is provided an opto-electronic device including at least one quantum dot prepared in accordance with any of the methods described herein.

In accordance with a still further aspect of the present invention, there is provided a light-emitting device including at least one quantum dot prepared in accordance with any of the methods described herein.

In accordance with a still further aspect of the present invention, there is provided a lamp including at least one quantum dot prepared in accordance with any of the methods described herein.

In accordance with a still further aspect of the present invention, there is provided a light bulb including at least one quantum dot prepared in accordance with any of the methods described herein.

In accordance with a still further aspect of the present invention, there is provided a luminaire including at least one quantum dot prepared in accordance with any of the methods described herein.

In certain embodiments of the various aspects and embodiments of the inventions described herein, the quantum dot core and shells are undoped.

In certain embodiments of the various aspects and embodiments of the inventions described herein, a quantum dot described herein can be included in a device, component, or product in the form of a composition in which it is included.

In accordance with certain aspects, oxygen and/or water may degrade semiconductor nanocrystals or quantum dots described herein during periods of high light flux exposure.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this invention.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1A:
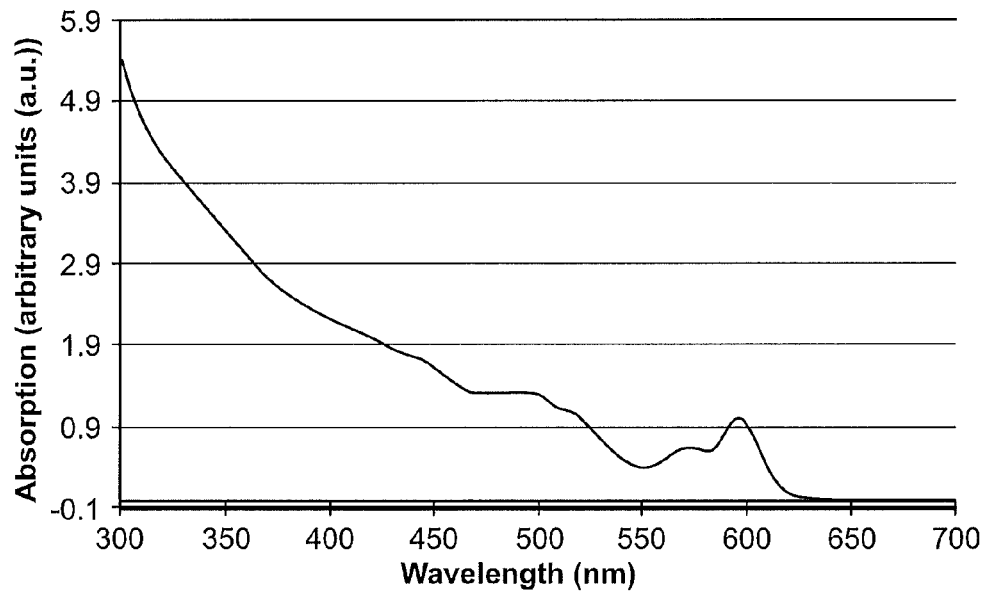
FIG. 1A graphically illustrates the absorption spectrum of the CdSe core referred to in Example III.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Embodiments of the present invention are directed to methods of making or processing core quantum dots or quantum dots resulting in an absence or substantial absence of amine species in the quantum dots at least at the outer surface thereof. According to one aspect, core quantum dots which may or may not have an absence or substantial absence of amine species are provided thereon with one or more coatings or layers or shells of a same or different material in the absence or substantial absence of an amine species to provide a core-shell quantum dot. According to a further aspect, core quantum dots having an absence or substantial absence of amine species are then provided with one or more coatings or layers or shells of a same or different material to provide a core-shell quantum dot in the absence or substantial absence of an amine species to provide a core-shell quantum dot.

Examples of amine species excluded from or substantially excluded from the methods and quantum dots taught herein include, but are not limited to, amines, aliphatic primary amines such as oleyl amine, octylamine and the like, aliphatic secondary amines such as dioctyl amine and the like, aliphatic tertiary amines such as trioctylamine and the like, and aromatic amines or semiaromatic amines such as pyridine, imidazole and the like.

Quantum dots or nanocrystals are nanometer sized semiconductor particles that can have optical properties arising from quantum confinement. Quantum dots can have various shapes, including, but not limited to a sphere, rod, disk, other shapes, and mixtures of various shaped particles. The particular composition(s), structure, and/or size of a quantum dot can be selected to achieve the desired wavelength of light to be emitted from the quantum dot upon stimulation with a particular excitation source. In essence, quantum dots may be tuned to emit light across the visible spectrum by changing their size. See C. B. Murray, C. R. Kagan, and M. G. Bawendi, *Annual Review of Material Sci.*, 2000, 30: 545-610 hereby incorporated by reference in its entirety. The narrow FWHM of quantum dots can result in saturated color emission. The broadly tunable, saturated color emission over the entire visible spectrum of a single material system is unmatched by any class of organic chromophores (see, for example, Dabbousi et al., *J. Phys. Chem.* 101, 9463 (1997), which is incorporated by reference in its entirety). A monodisperse population of quantum dots will emit light spanning a narrow range of wavelengths.

Exemplary quantum dots include, for example, quantum dots comprising a semiconductor material that can be represented by the formula MX, wherein M represents one or more metals and X represents one or more chalcogens and/or one or more pnictogens. Such quantum dots can be formed from quantum dot precursors comprising one or more M donors and one or more X donors which are capable of reacting to form the desired semiconductor material. In certain embodiments, the M donor and the X donor can be moieties within the same molecule. The M donor can be an inorganic compound, an organometallic compound, or elemental metal. For example, an M donor can comprise cadmium, zinc, magnesium, mercury, aluminum, gallium, indium or thallium, and the X donor can comprise a compound capable of reacting with the M donor to form a material with the general formula MX. Exemplary metal precursors include metal carboxylates. Exemplary metal precursors include dimethylcadmium, cadmium oleate and zinc oleate. The X donor can comprise a chalcogenide donor or source or a pnictide donor, such as a phosphine chalcogenide, a bis (silyl) chalcogenide, dioxygen, an ammonium salt, or a tris (silyl) pnictide. Suitable X donors include, for example, but are not limited to, dioxygen, bis(trimethylsilyl) selenide ((TMS)$_2$Se), trialkyl phosphine selenides such as (tri-noctylphosphine) selenide (TOPSe) or (tri-n-butylphosphine) selenide (TBPSe), trialkyl phosphine tellurides such as (tri-n-octylphosphine) telluride (TOPTe) or hexapropyl-phosphorustriamide telluride (HPPTTe), bis(trimethylsilyl) telluride ((TMS)$_2$Te), bis(trimethylsilyl)sulfide ((TMS)$_2$S), a trialkyl phosphine sulfide such as (tri-noctylphosphine) sulfide (TOPS), diallyl phosphine selenide, aliphatic thiol, triethyl phosphine sulfide, tributyl phosphine sulfide, sulfur-octadecene, selenium-octadecene, an ammonium salt such as an ammonium halide (e.g., NH$_4$Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor and the X donor can be moieties within the same molecule.

A quantum dot can comprise one or more semiconductor materials. Examples of semiconductor materials that can be included in a quantum dot (including, e.g., a semiconductor nanocrystal) include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group compound, an alloy including any of the foregoing, and/or a mixture including any of the foregoing, including ternary and quaternary mixtures or alloys. Examples of Group II elements include Zn, Cd, Hg. Examples of Group VI elements include oxygen, sulfur, selenium and tellurium. Examples of Group III elements include boron, aluminum, gallium, indium, and thallium. Examples of Group V elements include nitrogen, phosphorus, arsenic, antimony, and bismuth. Examples of Group IV elements include silicon, germanium, tin, and lead.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

In certain embodiments, quantum dots can comprise a core comprising one or more semiconductor materials and a shell comprising one or more semiconductor materials, wherein the shell is disposed over at least a portion, and preferably all, of the outer surface of the core. A quantum dot including a core and shell is also referred to as a "core/shell" structure.

For example, a quantum dot can include a core having the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as quantum dot cores include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing, including ternary and quaternary mixtures or alloys.

The X donor can comprise a chalcogenide donor where X is a chalcogenide including oxygen, sulfur, selenium, or tellurium, or mixtures thereof. Suitable chalcogenide donors include a reactive chalcogenide source, such as highly reactive chalcogenide sources such as (TMS)$_2$Se, (TMS)$_2$S, H$_2$S, chalcogenide mixtures such as octadecene-Se (ODE/Se), octadecene-S (ODE/S), amine-Se, amine-S and mixtures thereof and secondary phosphine chalcogenides such as a secondary phosphine sulfide, a secondary phosphine selenide, a secondary phosphine telluride, or a secondary phosphine oxide or mixtures thereof or dialkylphosphine chalcogenides such as diisobutylphosphine selenides, diisobutylphosphine sulfides, diphenylphosphine selenides or diphenylphosphine sulfides and the like or mixtures of any of the above.

A shell can be a semiconductor material having a composition that is the same as or different from the composition of the core. The shell can comprise an overcoat including one or more semiconductor materials on a surface of the core. Examples of semiconductor materials that can be included in a shell include, but are not limited to, a Group IV element, a Group II-VI compound, a Group II-V compound, a Group III-VI compound, a Group III-V compound, a Group IV-VI compound, a Group I-III-VI compound, a Group II-IV-VI compound, a Group II-IV-V compound, alloys including any of the foregoing, and/or mixtures including any of the foregoing, including ternary and quaternary mixtures or alloys. Examples include, but are not limited to, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture including any of the foregoing. For example, ZnS, ZnSe or CdS overcoatings can be grown on CdSe or CdTe semiconductor nanocrystals.

In a core/shell quantum dot, the shell or overcoating may comprise one or more layers. The overcoating can comprise at least one semiconductor material which is the same as or different from the composition of the core. Preferably, the overcoating has a thickness from about one to about ten monolayers. An overcoating can also have a thickness greater than ten monolayers. In certain embodiments, more than one overcoating can be included on a core. An example of an overcoating process is described, for example, in U.S. Pat. No. 6,322,901. By adjusting the temperature of the reaction mixture during overcoating and monitoring the absorption spectrum of the core, overcoated materials having high emission quantum efficiencies and narrow size distributions can be obtained. A particularly exemplary coating or layer or shell, such as for a core quantum dot, includes a Group II-VI semiconductor material. An example of a Group II-VI semiconductor material is zinc chalcogenide. One example of a Group II-VI zinc chalcogenide semiconductor material includes ZnS. Another example of a Group II-VI zinc chalcogenide semiconductor material includes ZnSe. One or more additional coatings or layers or shells can also be included in a core-shell quantum dot particle. An additional particularly exemplary coating includes $Cd_xZn_{1-x}S$ and further as a second coating over a first ZnS or ZnSe coating on a core quantum dot particle. In certain embodiments, the core particle can comprise a Group II-VI semiconductor material. In certain embodiments, the core particle can comprise a Group III-V semiconductor material. Core particles comprising other semiconductor materials can also be used.

In certain embodiments, the quantum dot particle includes a core and a first shell comprising zinc chalcogenide and at least a second shell comprising a second semiconductor material.

In certain embodiments, the first shell comprises a first semiconductor material and has a thickness greater than or equal to the thickness of 1 monolayer of the first semiconductor material.

In certain embodiments, the first shell has a thickness up to the thickness of about 20 monolayers of the first semiconductor material, for example, 1-20, 1-15, 5-20, 5-15, 8-20, and 8-15 monolayers. Other thicknesses within or outside these ranges may also be determined to be desirable.

In certain embodiments, the quantum dot can include a second shell. In certain of such embodiments, the second shell can comprise a second semiconductor material.

In certain embodiments wherein the quantum dot includes a second shell, the second shell can have a thickness greater than or equal to the thickness of 1 monolayer of the material from which it is constituted, e.g., the second semiconductor material. In certain of such embodiments, the second shell can have a thickness up to the thickness of about 25 monolayers, for example, 1-25, 1-22, 5-25, 5-22, 5-20, 8-25, 8-22, and 8-18 monolayers. Other thicknesses within or outside these ranges may also be determined to be desirable.

In certain embodiments, a quantum dot particle may include one or more additional shells over the second shell.

In certain embodiments, the second shell and/or additional outer shell comprises a semiconductor material including one or more metals wherein the one or metals comprises from 0 up to 100% cadmium.

In certain embodiments, the second shell is the outer shell of the core-shell quantum dot particle.

In one example of a preferred embodiment, the quantum dot includes a core comprising CdSe, a first shell comprising zinc chalcogenide at a thickness of about 8-15 monolayers, and a second shell comprises $Cd_{1-x}Zn_xS$ wherein 0≤x≤1 at a thickness of about 8-18 monolayers of $Cd_{1-x}Zn_xS$.

In certain preferred embodiments, the cadmium content of a shell comprising a semiconductor material represented by the formula $Cd_{1-x}Zn_xS$ is from zero up to 100 mol % of the total Cd and Zn content. For example, the cadmium content can be 100 mole % (Zn content is zero), the cadmium content can be from zero up to 80 mol percent, from zero up to about 60 mol percent, from zero up to about 40 mol percent, from zero up to about 33 mol percent, from zero up to about 20 mol percent, from zero up to about 15 mol percent, from zero up to about 10 mol percent. In certain embodiments, the cadmium content is greater than zero.

In certain embodiments of the various aspects of the invention described herein, the quantum dot can include a core comprising a first semiconductor material, a first shell comprising zinc chalcogenide, and a second shell comprising a second semiconductor material, wherein the first shell has a bandgap which is greater than that of the second shell.

In certain embodiments of the various aspects of the invention described herein, the quantum dot can include a core comprising a first semiconductor material, a first shell comprising zinc chalcogenide, and a second shell comprising second semiconductor material, wherein the first shell has a bandgap which is greater than that of the second shell, and the bandgap of the first shell is also greater than that of the core.

In certain embodiments of the various aspect of the invention described herein, the quantum dot can include a core comprising a first semiconductor material, a first shell comprising zinc chalcogenide, a second shell comprising a second semiconductor material, and a third shell comprising a third semiconductor material, wherein the third shell has a bandgap that is the same as or greater than that of the first shell and the second shell has a bandgap that is less than that of the first shell.

Such coatings are exemplary to produce a core-shell quantum dot particle in the absence of amines Such coatings are advantageous to produce a core-shell quantum dot particle using high temperature coating methods such as methods which use a temperature of about 300° C. and above.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of quantum dot (e.g., semiconductor nanocrystal) (core)shell1/shell2 materials include, without limitation: red (e.g., (CdSe)ZnS/CdZnS, or (CdSe)ZnSe/CdZnS (core) shell1/shell2), green (e.g., (CdZnSe)ZnS/CdZnS, (CdSe)ZnS/ZnS, (CdSe)ZnS/CdZnS, or (CdSe)ZnSe/CdZnS (core) shell1/shell2, etc.), and blue (e.g., (CdS)ZnS/CdZnS, (CdSe)ZnS/ZnS, or (CdSe)ZnSe/ZnS (core)shell1/shell2.)

Quantum dots can have various shapes, including, but not limited to a sphere, rod, disk, other shapes, and mixtures of various shaped particles.

Methods of making quantum dots are known. One example of a method of making a quantum dot (including, for example, but not limited to, a semiconductor nanocrystal) is a colloidal growth process. Colloidal growth occurs by injecting an M donor and an X donor into a hot coordinating solvent. One example of a preferred method for preparing monodisperse quantum dots comprises pyrolysis of organometallic reagents, such as dimethyl cadmium, injected into a hot, coordinating solvent. This permits discrete nucleation and results in the controlled growth of macroscopic quantities of quantum dots. The injection produces a nucleus that can be grown in a controlled manner to form a quantum dot. The reaction mixture can be gently heated to grow and anneal the quantum dot. Both the average size and the size distribution of the quantum dots in a sample are dependent on the growth temperature. The growth temperature for maintaining steady growth increases with increasing average crystal size. Resulting quantum dots are members of a population of quantum dots. As a result of the discrete nucleation and controlled growth, the population of quantum dots that can be obtained has a narrow, monodisperse distribution of diameters. The monodisperse distribution of diameters can also be referred to as a "size." Preferably, a monodisperse population of particles includes a population of particles wherein at least about 60% of the particles in the population fall within a specified particle size range. A population of monodisperse particles preferably deviate less than 15% rms (root-mean-square) in diameter and more preferably less than 10% rms and most preferably less than 5%.

Another example of a method for making quantum dots comprising a semiconductor material that can be represented by the formula MX, wherein M represents one or more metals and X represents one or more chalcogens and/or one or more pnictogens, comprises combining precursors comprising one or more M donors and one or more X donors at a reaction temperature to form a reaction mixture. The reaction is then terminated or quenched. In certain aspects, an X donor can be added to a solution of a metal source or M donor at a reaction temperature to form a reaction mixture. The reaction is then terminated or quenched. In certain aspects, an M donor can be added to a solution of an X donor at a reaction temperature to form a reaction mixture. The reaction is then terminated or quenched. In certain aspects, an M donor and an X donor can be added to a reaction medium simultaneously. Preferably, the reaction is terminated or quenched so as to stop growth of the quantum dots before the quantum dots ripen or broaden or combine together. The reaction can be terminated or quenched, for example, by cooling the reaction mixture to a quenching temperature effective to terminate or quench the nucleation process in a manner to stop or limit further growth of the semiconductor nanocrystals. Preferably, the reaction mixture is cooled to a temperature effective to quench or stop growth of the semiconductor nanocrystals formed in the reaction mixture prior to ripening or broadening or combining of the quantum dots. Quantum dots are present in the reaction vessel and may be isolated or recovered. The quantum dots in the reaction vessel or the quantum dots after isolation or recovery may be subjected to further growth by exposure to an M donor and an X donor. According to this aspect, the quantum dots are exposed to an M donor and an X donor under suitable reaction conditions such that the quantum dots grow in size using the M donor and X donor. The M donor and the X donor can be provided to a reaction vessel including the quantum dots as a substantially steady or substantially constant infusion or feed or source such that as the M donor and the X donor are consumed or otherwise used to grow the quantum dots, additional supply of M donor and X donor are provided to the reaction vessel, such as in a substantially continuous manner, to continue growth of the quantum dots until a desired quantum dot size is reached.

According to certain methods of making quantum dots, the liquid medium includes solvents such as coordinating solvents. A coordinating solvent can help control the growth of the quantum dot. Alternatively, non-coordinating solvents can also be used in certain applications. A coordinating solvent is a compound having a donor lone pair, for example, a lone electron pair available to coordinate to a surface of the growing quantum dot (including, e.g., a semiconductor nanocrystal). Solvent coordination can stabilize the growing quantum dot. Examples of coordinating solvents include alkyl phosphines, alkyl phosphine oxides, alkyl phosphonic acids, or alkyl phosphinic acids, however, other coordinating solvents, such as pyridines, furans, and amines may also be suitable for the quantum dot (e.g., semiconductor nanocrystal) production. Additional examples of suitable coordinating solvents include pyridine, tri-n-octyl phosphine (TOP), tri-n-octyl phosphine oxide (TOPO) and trishydroxylpropylphosphine (tHPP), tributylphosphine, tri(dodecyl)phosphine, dibutyl-phosphite, tributyl phosphite, trioctadecyl phosphite, trilauryl phosphite, tris(tridecyl) phosphite, triisodecyl phosphite, bis(2-ethylhexyl)phosphate, tris(tridecyl) phosphate, hexadecylamine, oleylamine, octadecylamine, bis(2-ethylhexyl)amine, octylamine, dioctylamine, trioctylamine, dodecylamine/laurylamine, didodecylamine tridodecylamine, hexadecylamine, dioctadecylamine, trioctadecylamine, phenylphosphonic acid, hexylphosphonic acid, tetradecylphosphonic acid, octylphosphonic acid, octadecylphosphonic acid, propylenediphosphonic acid, phenylphosphonic acid, aminohexylphosphonic acid, dioctyl ether, diphenyl ether, methyl myristate, octyl octanoate, N-dodecylpyrrolidone (NDP), and hexyl octanoate. In certain embodiments, technical grade TOPO can be used. As will be appreciated by the skilled artisan, in aspects of the invention calling for the absence or substantial absence of amine species, use of amine-containing solvents are preferably avoided.

According to certain aspects, reaction conditions in a process for making quantum dots are provided where amine based components in the reaction mixture are substantially completely reacted or otherwise used during the process such that free or unreacted or unbound amine species or byproducts thereof are absent or substantially absent in the reaction mixture when quantum dots of desired size are obtained.

According to certain aspects, reaction conditions in a process for making quantum dots are provided where amine based components in the reaction mixture are absent such that free or unreacted or unbound amine species or byproducts thereof are absent or substantially absent in the reaction mixture when quantum dots of desired size are obtained.

When making quantum dots using amine species resulting in bound amine species, such bound amine species may be removed and/or diluted away such as by using a metal carboxylate species during a high temperature coating process resulting in quantum dots which lack or substantially lack amine species on their surface as bound ligands. Such quantum dots may include core quantum dots comprising an II-VI semiconductor material characterized as yellow, orange or red emitters which may be larger in size than quantum dots characterized as green or blue emitters or emitters having an emission of less than 530 nm. According to certain aspects, low energy emitters such as yellow, orange or red quantum dots are made by growing II-VI core quantum dots and substantially completely consuming amine species in the reaction mixture. Once such cores are precipitated out of solution, there are substantially no amine species or byproducts thereof remaining in the reaction solution and accordingly in the core quantum dots prior to the coating process.

The narrow size distribution of the quantum dots (including, e.g., semiconductor nanocrystals) allows the possibility of light emission in narrow spectral widths. Monodisperse semiconductor nanocrystals have been described in detail in Murray et al. (*J. Am. Chem. Soc.*, 115:8706 (1993)); and in the thesis of Christopher Murray entitled "Synthesis and Characterization of II-VI Quantum Dots and Their Assembly into 3-D Quantum Dot Superlattices", Massachusetts Institute of Technology, September, 1995. The foregoing are hereby incorporated herein by reference in their entireties.

The process of controlled growth and annealing of the quantum dots in the coordinating solvent that follows nucleation can also result in uniform surface derivatization and regular core structures. As the size distribution sharpens, the temperature can be raised to maintain steady growth. By adding more M donor or X donor, the growth period can be shortened. Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for CdSe and CdTe, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

Quantum dots (e.g., semiconductor nanocrystals) preferably further include ligands attached thereto. According to one aspect, quantum dots within the scope of the present invention include green CdSe quantum dots having oleic acid ligands and red CdSe quantum dots having oleic acid ligands. Alternatively, or in addition, octadecylphosphonic acid ("ODPA") ligands may be used instead of oleic acid ligands. The ligands promote solubility of the quantum dots in the polymerizable composition which allows higher loadings without agglomeration which can lead to red shifting.

Ligands can be derived from a coordinating solvent that may be included in the reaction mixture during the growth process. Ligands can be added to the reaction mixture. Ligands can be derived from a reagent or precursor included in the reaction mixture for synthesizing the quantum dots. Ligands can be exchanged with ligands on the surface of a quantum dot. In certain embodiments, quantum dots can include more than one type of ligand attached to an outer surface.

According to one aspect of the present invention, quantum dots described herein include aliphatic ligands attached thereto. Such aliphatic ligands promote adhesion with a carrier particle. Such aliphatic ligands promote solubility or dispersability of the quantum dots bound to the carrier particles in a curable or polymerizable matrix material. According to one aspect, exemplary ligands include fatty acid ligands, long chain fatty acid ligands, oleic acid ligands and octadecylphosphonic acid ("ODPA") ligands.

Ligands can be derived from a coordinating solvent that may be included in the reaction mixture during the growth process. Alternatively, ligands can be added to the reaction mixture or ligands can be derived from a reagent or precursor included in the reaction mixture for synthesizing the quantum dots. In certain embodiments, quantum dots can include more than one type of ligand attached to an outer surface.

A quantum dot surface includes ligands derived from the growth process or otherwise can be modified by repeated exposure to an excess of a competing ligand group (including, e.g., but not limited to, a coordinating group) to form an overlayer. For example, a dispersion of the capped quantum dots can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the quantum dot, including, for example, but not limited to, phosphines, thiols, amines and phosphates.

For example, a quantum dot can be exposed to short chain polymers which exhibit an affinity for the surface and which terminate in a moiety having an affinity for a suspension or dispersion medium. Such affinity improves the stability of the suspension and discourages flocculation of the quantum dot. Examples of additional typical ligands include fatty acids, long chain fatty acids, oleic acid, alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO), tris-hydroxylpropylphosphine (tHPP) and octadecylphosphonic acid ("ODPA"). Technical grade TOPO can be used. As will be appreciated by the skilled artisan, in aspects of the invention calling for the absence or substantial absence of amine species, use of amine-containing species as ligands are preferably avoided.

Suitable coordinating ligands can be purchased commercially or prepared by ordinary synthetic organic techniques, for example, as described in J. March, Advanced Organic Chemistry, which is incorporated herein by reference in its entirety.

According to an additional aspect, the surface of core quantum dots can be altered or supplemented or otherwise reconstructed using metal carboxylate species. This is particularly advantageous to remove amine species which may be bound to the core quantum dot. According to this aspect, CdSe, ZnS or ZnSe may be grown on core quantum dots using carboxylate based precursors including $Cd(oleate)_2$ and the like and then coated with $Cd_xZn_{1-x}S$ (wherein $0 \leq x \leq 1$) in situ. Alternatively, the quantum dots may be isolated and then coated with $Cd_xZn_{1-x}S$ using the high temperature coating methods described herein.

According to a certain aspect, the use of carboxylate based precursors with small CdSe core quantum dots (less than 500 nm absorbance peak) to further grow the size of the quantum dots results in the surface of the quantum dots having a plurality of carboxylic acid ligands. According to this aspect, the Cd precursor may be carboxylate based including $Cd(oleate)_2$ and the Se precursor may be dialkylphosphine-selenide such as diisobutylphosphine selenide or diphenylphosphine selenide. The growth process produces high quality monodisperse CdSe cores with a first absorbance peak tunable between 450-600 nm. The growth process allows in-situ high temperature overcoating of a first shell comprising a zinc chalcogenide. Further formation of a second shell comprising $Cd_xZn_{1-x}S$ (wherein $0 \leq x \leq 1$) can produce green emitters emitting between 500-540 nm, yellow emitters emitting between 540-590 nm and red emitters emitting between 590-630 nm with high solution quantum yield (QY) (about 80%), narrow FWHM (20-35 nm) and high external quantum efficiency in the solid state (90-95%).

According to an additional aspect, a method of making quantum dots having a coating thereon is provided which includes providing a reaction mixture of core quantum dots, a zinc carboxylate and a chalcogen (e.g., sulfur, selenium, etc.) source at a temperature of greater than 280° C. in the substantial absence of an amine species and for a period of time to complete a shell or layer or coating, such as, for example, 10 minutes, 15 minutes, 30 minutes, or such other time as may be determined by the skilled artisan; providing a first coating on the core quantum dots from the zinc carboxylate and chalcogen source to form first coated quantum dots; combining an additional metal carboxylate and an additional chalcogenide source with the first coated quantum dots at a temperature of greater than 280° C. in the substantial absence of an amine species; and providing a second coating on the first coated quantum dots from the additional metal carboxylate and the additional chalcogenide source.

According to one aspect, the core quantum dots include group II-VI elements. According to one aspect, a first coating of Zn-chalcogenide is provided on the core quantum dots in the absence of amine species. According to one aspect, a second coating of $Cd_xZn_{1-x}S$ (wherein $0 \leq x \leq 1$) is provided on the core quantum dots in the absence of amine species. According to one aspect, the core quantum dots are CdSe quantum dots. According to one aspect, a reaction mixture is provided for use in coating quantum dots comprising core quantum dots, zinc carboxylate and a chalcogen source in the substantial absence of an amine species. According to one aspect, quantum dots are provided having one or more coatings wherein the one or more coatings are substantially free of amine species. According to one aspect, a method of making quantum dots having a coating thereon is provided comprising coating core quantum dots with at least one semiconductor shell in the substantial absence of an amine species. According to one aspect, a first semiconductor shell of Zn-chalcogenide is placed on the core quantum dot. According to one aspect, a second semiconductor shell of $Cd_xZn_{1-x}S$ (wherein $0 \leq x \leq 1$) is placed on the first semiconductor shell of Zn-chalcogenide. According to one aspect, a quantum dot is provided including a core quantum dot and at least one semiconductor shell wherein the quantum dot is substantially free of an amine species. According to one aspect, the core quantum dots have a first semiconductor shell of Zn-chalcogenide. According to one aspect, the core quantum dots have a second semiconductor shell of $Cd_xZn_{1-x}S$ (wherein $0 \leq x \leq 1$) over the first semiconductor shell of Zn-chalcogenide.

According to an additional aspect, a method of making quantum dots having a coating thereon is provided which includes providing a reaction mixture of core quantum dots, a zinc carboxylate and a sulfur source at a temperature of greater than 280° C. in the substantial absence of an amine species and for a period of time to complete a shell or layer or coating, such as, for example, 10 minutes, 15 minutes, 30 minutes, or such other time as may be determined by the skilled artisan; providing a first coating on the core quantum dots from the zinc carboxylate and sulfur source to form first coated quantum dots; combining an additional metal carboxylate and an additional chalcogenide source with the first coated quantum dots at a temperature of greater than 280° C. in the substantial absence of an amine species; and providing a second coating on the first coated quantum dots from the additional metal carboxylate and the additional chalcogenide source. According to one aspect, the core quantum dots include group II-VI elements. According to one aspect, a first coating of ZnS is provided on the core quantum dots in the absence of amine species. According to one aspect, a second coating of $Cd_xZn_{1-x}S$ (wherein $0 \leq x \leq 1$) is provided on the core quantum dots in the absence of amine species. According to one aspect, the core quantum dots are CdSe quantum dots. According to one aspect, a reaction mixture is provided for use in coating quantum dots comprising core quantum dots, zinc carboxylate and a sulfur source in the substantial absence of an amine species. According to one aspect, quantum dots are provided having one or more coatings wherein the one or more coatings are substantially free of amine species. According to one aspect, a method of making quantum dots having a coating thereon is provided comprising coating core quantum dots with at least one semiconductor shell in the substantial absence of an amine species. According to one aspect, a first semiconductor shell of ZnS is placed on the core quantum dot. According to one aspect, a second semiconductor shell of $Cd_XZn_{1-X}S$ (wherein 0≤x≤1) is placed on the first semiconductor shell of ZnS. According to one aspect, a quantum dot is provided including a core quantum dot and at least one semiconductor shell wherein the quantum dot is substantially free of an amine species. According to one aspect, the core quantum dots have a first semiconductor shell of ZnS. According to one aspect, the core quantum dots have a second semiconductor shell of $Cd_XZn_{1-X}S$ (wherein 0≤x≤1) over the first semiconductor shell of ZnS.

According to an additional aspect, a method of making quantum dots having a coating thereon is provided which includes providing a reaction mixture of core quantum dots, a zinc carboxylate and a selenium source at a temperature of greater than 300° C. in the substantial absence of an amine species and for a period of time to complete a shell or layer or coating, such as, for example, 10 minutes, 15 minutes, 30 minutes, or such other time as may be determined by the skilled artisan; providing a first coating on the core quantum dots from the zinc carboxylate and selenium source to form first coated quantum dots; combining an additional metal carboxylate and an additional chalcogenide source with the first coated quantum dots at a temperature of greater than 280° C. in the substantial absence of an amine species; and providing a second coating on the first coated quantum dots from the additional metal carboxylate and the additional chalcogenide source. According to one aspect, the core quantum dots include group II-VI elements. According to one aspect, a first coating of ZnSe is provided on the core quantum dots in the absence of amine species. According to one aspect, a second coating of $Cd_XZn_{1-X}S$ (wherein 0≤x≤1) is provided on the core quantum dots in the absence of amine species. According to one aspect, the core quantum dots are CdSe quantum dots. According to one aspect, a reaction mixture is provided for use in coating quantum dots comprising core quantum dots, zinc carboxylate and a selenium source in the substantial absence of an amine species. According to one aspect, quantum dots are provided having one or more coatings wherein the one or more coatings are substantially free of amine species. According to one aspect, a method of making quantum dots having a coating thereon is provided comprising coating core quantum dots with at least one semiconductor shell in the substantial absence of an amine species. According to one aspect, a first semiconductor shell of ZnSe is placed on the core quantum dot. According to one aspect, a second semiconductor shell of $Cd_XZn_{1-X}S$ (wherein 0≤x≤1) is placed on the first semiconductor shell of ZnSe. According to one aspect, a quantum dot is provided including a core quantum dot and at least one semiconductor shell wherein the quantum dot is substantially free of an amine species. According to one aspect, the core quantum dots have a first semiconductor shell of ZnSe. According to one aspect, the core quantum dots have a second semiconductor shell of $Cd_XZn_{1-X}S$ (wherein 0≤x≤1) over the first semiconductor shell of ZnSe.

In certain embodiments, a dispersion of CdSe cores in a liquid medium are heated up to 320° C. in the presence of a zinc carboxylate (e.g., $Zn(Oleate)_2$). At 320° C., a chalcogen source is introduced over a period of, for example, 15 minutes, as the temperature is maintained between 320-330° C. The amount of Zn and chalcogen determine the thickness of the first shell, and Zn is preferably included in the reaction mixture in molar excess while the first shell is formed. At the end of the addition of chalcogen, the CdSe/Zn-chalcogen core/shell material is preferably annealed (e.g., at a temperature between 320-330° C. for 5 minutes), upon which secondary shell precursors are infused over a preselected period of time at a preselected temperature. In certain embodiments, the temperature can be at or about the temperature at which the first shell is annealed. At the end of the infusion of precursors for the second shell, the core/shell1/shell2 sample is preferably annealed (e.g., at a temperature of 320-330° C.). The reaction mixture can thereafter be cooled or otherwise returned to room temperature. The core/shell1/shell2 nanocrystals can thereafter be purified. In one particular example, the second shell precursors include $Cd(Oleate)_2$, $Zn(Oleate)_2$, and dodecanethiol. Preferably, such precursors are infused over a period of 30 minutes at a temperature held between 320-330° C.; at the end of the precursor infusion, the core/shell1/shell2 sample can be annealed for 5 minutes at 320-330° C., and cooled to room temperature for purification.

In one particular example, a first shell comprising ZnSe can be prepared as follows. The quantum dot core to be coated is put into a reaction vessel along with a zinc carboxylate precursor (e.g., $Zn(Oleate)_2$). The amount of the zinc carboxylate precursor present in the reaction vessel relative to the core can determine the number of monolayers of the first shell that can be formed. The reaction vessel with cores and the zinc carboxylate precursor is heated up to a temperature greater than 300° C. (e.g., 320° C.), upon which a solution of selenium precursor (e.g., diisobutylphosphine selenide (DIBP-Se) dissolved in n-dodecylpyrrolidone (NDP)) is infused. The amount of selenium precursor infused is equal to 0.6 molar equivalents to the Zn in the zinc carboxylate precursor present in the reaction vessel, and this amount is delivered in a controlled manner over a preselected period of time (e.g., 15 min at 320-330° C.). A molar excess of Zn to Se is most preferred. For example, as the Se to Zn molar equivalent is varied from 0.6 to 1.0, a sharp decrease in final Core/Shell EQE is observed as the ratio approaches 1.0.

The thickness of the first shell comprising ZnSe can be varied from 1 monolayer (also abbreviated herein as "ML") to up to 20 ML. For example, a first shell comprising ZnSe with a thickness from 1 to 17 ML has demonstrated maintenance of >95% EQE. It is generally observed that the thicker the first shell comprising ZnSe, the less the EQE drops at high temperature. For example, for first shell comprising ZnSe with a thickness of about 8.5 ML, the final core/shell EQE drops less than 1% up to 140° C.; from 8.5 ML to 15 ML<1% drop in EQE can be achieved at temperatures up to 140° C. with maintenance of an initial EQE of >95%. In certain embodiments, as the thickness of the first shell comprising ZnSe is increased, the total infusion time is preferably fixed, e.g., at 15 min.

In certain embodiments, an additional shell comprising $Cd_{1-x}Zn_xS$ (wherein 0≤x≤1) can be added after a first shell comprising a zinc chalcogenide. The additional shell is preferably formed after the first shell in an in situ fashion (e.g., without isolation of the particle prior to formation of the additional shell). For example, a cadmium precursor (e.g., $Cd(Oleate)_2$) and zinc precursor (e.g., $Zn(Oleate)_2$) are mixed at varying proportions, from greater than 0% Cd to 100% Cd. The sulfur precursor is preferably a long-chain aliphatic thiol, such as dodecanethiol.

In certain preferred embodiments, the ratio of the molar equivalents of sulfur to the total molar equivalents of Cd+Zn is greater than one. For example, the ratio can be from greater than one to 4. It is observed that variations in this ratio can affect the total incorporation of Zn relative to Cd into the shell, as well as the final optical properties, such as absorbance profile, EQE, and emission wavelength. As the Sulfur:Metal ratio is increased from 1 to 4, the following has been observed:

An increase in the absorbance spectrum of the final core/shell particle at 325 nm versus 450 nm as the sulfur ratio is increased A decrease in solubility in a non-polar solvent such as Toluene after purification of the resulting quantum dots as the sulfur ratio is increased during overcoating.

A plateau in terms of EQE at ratios of 2-3, with a drop in EQE as the ratio approaches 4.

Table 1 below outlines the effect of varying the sulfur to total cadmium+zinc in forming a second semiconductor shell of $Cd_XZn_{1-X}S$ over a first semiconductor shell comprising ZnSe over a core comprising CdSe.

TABLE 1

The Effect Of Varying The Sulfur:Metal Ratio On The Optical And Solution Properties Of The Final Core/Shell Material

| Sample | S:M Ratio | Emission (FWHM) | % EQE | Solubility in Toluene |
|---|---|---|---|---|
| 153-836 | 2 | 587 (23) | 98% | Good |
| 153-837 | 3 | 580 (20) | 95% | Good |
| 153-831 | 4 | 577 (20) | 92% | Poor |

Figure 3:
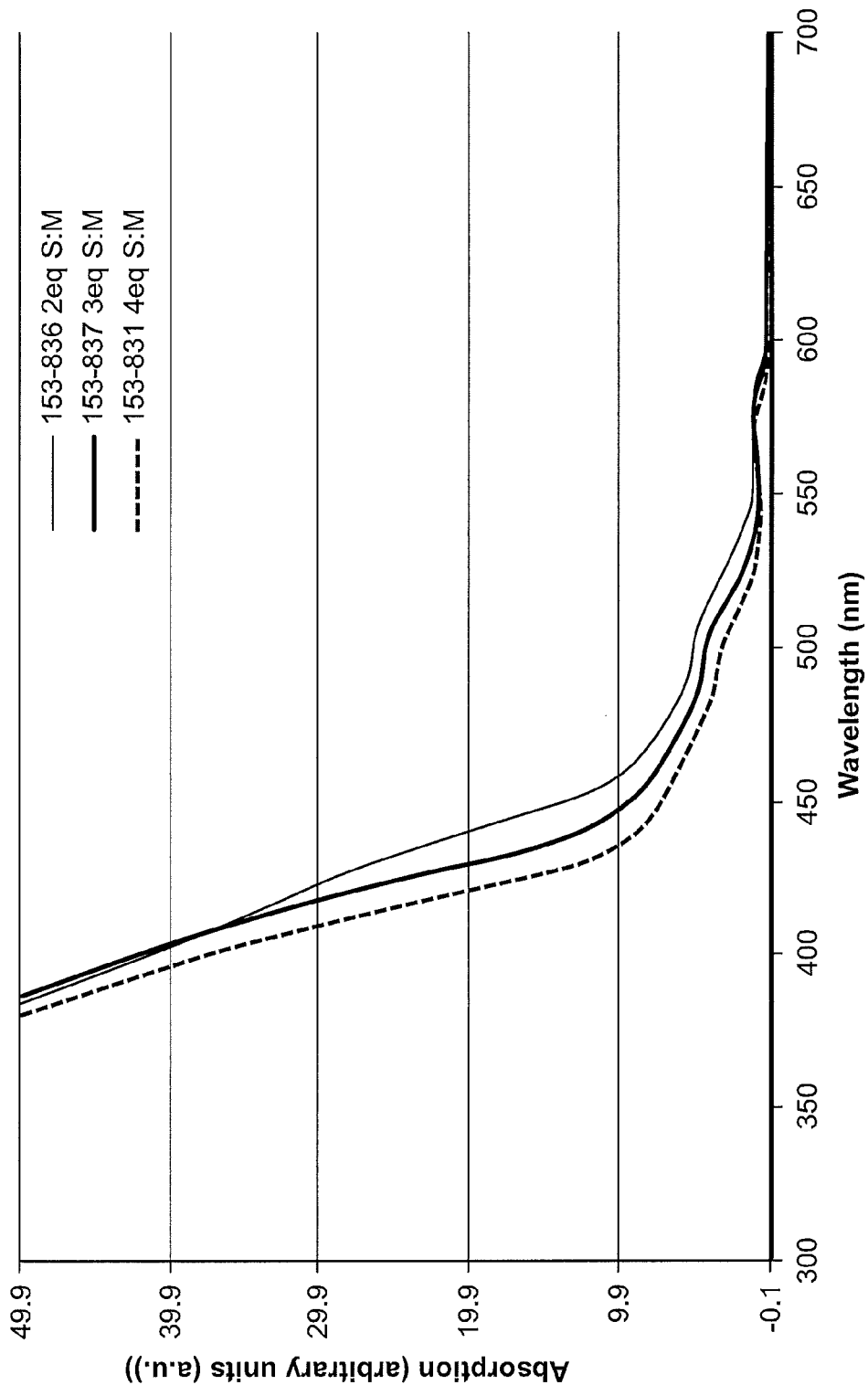
FIG. 3 graphically illustrates the effect of varying the Sulfur to Metal ratio on the absorbance spectrum (normalized to the first excitonic features.)

The effect of varying the equivalents of Sulfur to Total equivalents of cadmium+zinc in the second shell overcoating preparation on the absorbance spectrum is shown in FIG. 3.

The emission from a quantum dot capable of emitting light can be a narrow Gaussian emission band that can be tuned through the complete wavelength range of the ultraviolet, visible, or infra-red regions of the spectrum by varying the size of the quantum dot, the composition of the quantum dot, or both. For example, a semiconductor nanocrystal comprising CdSe can be tuned in the visible region; a semiconductor nanocrystal comprising InAs can be tuned in the infra-red region. The narrow size distribution of a population of quantum dots capable of emitting light can result in emission of light in a narrow spectral range. The population can be monodisperse preferably exhibiting less than a 15% rms (root-mean-square) deviation in diameter of such quantum dots, more preferably less than 10%, most preferably less than 5%. Spectral emissions in a narrow range of no greater than about 75 nm, preferably no greater than about 60 nm, more preferably no greater than about 40 nm, and most preferably no greater than about 30 nm full width at half max (FWHM) for such quantum dots that emit in the visible can be observed. IR-emitting quantum dots can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of the light-emitting quantum dot diameters decreases.

Quantum dots can have emission quantum efficiencies such as between 0% to greater than 95%, for example in solution, such as greater than 10%, 20%, 30%, 40%, 50%, 60%, 70%, 80%, or 90%.

The narrow FWHM of quantum dots can result in saturated color emission. The broadly tunable, saturated color emission over the entire visible spectrum of a single material system is unmatched by any class of organic chromophores (see, for example, Dabbousi et al., J. Phys. Chem. 101, 9463 (1997), which is incorporated by reference in its entirety). A monodisperse population of quantum dots will emit light spanning a narrow range of wavelengths.

In certain embodiments of the present invention, quantum dots that emit wavelengths characteristic of red light are desirable. In certain preferred embodiments, quantum dots capable of emitting red light emit light having a peak center wavelength in a range from about 615 nm to about 635 nm, and any wavelength in between whether overlapping or not. For example, the quantum dots can be capable of emitting red light having a peak center wavelength of about 630 nm, of about 625 nm, of about 620 nm, or of about 615 nm.

In certain embodiments of the present invention, quantum dots that emit a wavelength characteristic of green light are desirable. In certain preferred embodiments, quantum dots capable of emitting green light emit light having a peak center wavelength in a range from about 520 nm to about 545 nm, and any wavelength in between whether overlapping or not. For example, the quantum dots can be capable of emitting green light having a peak center wavelength of about 520 nm, of about 525 nm, of about 535 nm, or of about 540 nm.

According to further aspects of the present invention, the quantum dots exhibit a narrow emission profile in the range of between about 20 nm and about 60 nm at full width half maximum (FWHM). The narrow emission profile of quantum dots of the present invention allows the tuning of the quantum dots and mixtures of quantum dots to emit saturated colors thereby increasing color gamut and power efficiency beyond that of conventional LED lighting displays. According to one aspect, green quantum dots designed to emit a predominant wavelength of, for example, about 523 nm and having an emission profile with a FWHM of about, for example, 37 nm are combined, mixed or otherwise used in combination with red quantum dots designed to emit a predominant wavelength of about, for example, 617 nm and having an emission profile with a FWHM of about, for example 32 nm Such combinations can be stimulated by blue light to create trichomatic white light.

Quantum dots in accordance with the present invention can be included in various formulations depending upon the desired utility. According to one aspect, quantum dots are included in flowable formulations or liquids to be included, for example, into clear vessels which are to be exposed to light. Such formulations can include various amounts of one or more type of quantum dots and one or more host materials. Such formulations can further include one or more scatterers. Other optional additives or ingredients can also be included in a formulation. In certain embodiments, a formulation can further include one or more photo initiators. One of skill in the art will readily recognize from the present invention that additional ingredients can be included depending upon the particular intended application for the quantum dots.

An optical material, other composition, or formulation within the scope of the invention may include a host material, such as in the case of an optical component, which may be present in an amount from about 50 weight percent and about 99.5 weight percent, and any weight percent in between whether overlapping or not. In certain embodiment, a host material may be present in an amount from about 80 to about 99.5 weight percent. Examples of specific useful host materials include, but are not limited to, polymers, oligomers, monomers, resins, binders, glasses, metal oxides, and other nonpolymeric materials. Preferred host materials include polymeric and non-polymeric materials that are at least partially transparent, and preferably fully transparent, to preselected wavelengths of light. In certain embodiments, the preselected wavelengths can include wavelengths of light in the visible (e.g., 400-700 nm) region of the electromagnetic spectrum. Preferred host materials include cross-linked polymers and solvent-cast polymers. Examples of other preferred host materials include, but are not limited to, glass or a transparent resin. In particular, a resin such as a non-curable resin, heat-curable resin, or photocurable resin is suitably used from the viewpoint of processability. Specific examples of such a resin, in the form of either an oligomer or a polymer, include, but are not limited to, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like. Other suitable host materials can be identified by persons of ordinary skill in the relevant art.

Host materials can also comprise silicone materials. Suitable host materials comprising silicone materials can be identified by persons of ordinary skill in the relevant art.

In certain embodiments and aspects of the inventions contemplated by this invention, a host material comprises a photocurable resin. A photocurable resin may be a preferred host material in certain embodiments, e.g., in embodiments in which the composition is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when the photo-sensitizer is not used. These resins may be used individually or in combination of two or more.

In certain embodiments and aspects of the inventions contemplated by this invention, a host material can comprise a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers or oligomers forming these resins, and the like can be dissolved in solvents known to those skilled in the art. Upon evaporation of the solvent, the resin forms a solid host material for the semiconductor nanoparticles.

In certain embodiments, acrylate monomers and/or acrylate oligomers which are commercially available from Radcure and Sartomer can be preferred.

Quantum dots can be encapsulated. Nonlimiting examples of encapsulation materials, related methods, and other information that may be useful are described in International Application No. PCT/US2009/01372 of Linton, filed 4 Mar. 2009 entitled "Particles Including Nanoparticles, Uses Thereof, And Methods" and U.S. Patent Application No. 61/240,932 of Nick et al., filed 9 Sep. 2009 entitled "Particles Including Nanoparticles, Uses Thereof, And Methods", each of the foregoing being hereby incorporated herein by reference in its entirety.

The total amount of quantum dots included in an optical material, such as a host material for example a polymer matrix, within the scope of the invention is preferably in a range from about 0.05 weight percent to about 5 weight percent, and any weight percent in between whether overlapping or not. The amount of quantum dots included in an optical material can vary within such range depending upon the application and the form in which the quantum dots are included (e.g., film, optics (e.g., capillary), encapsulated film, etc.), which can be chosen based on the particular end application. For instance, when an optic material is used in a thicker capillary with a longer pathlength (e.g., such as in a backlight unit (BLU) for large screen television applications), the concentration of quantum dots can be closer to 0.5%. When an optical material is used in a thinner capillary with a shorter pathlength (e.g., such as in BLUs for mobile or hand-held applications), the concentration of quantum dots can be closer to 5%.

The quantum dots used in a formulation, optical material, or other composition are selected based on the desired peak emission wavelength or combinations of wavelengths described for the particular intend end-use application for the formulation, optical material, or other composition.

When quantum dots emit light with peak emission wavelengths that differ from that of other quantum dots included in a particular embodiments, the amounts of each are selected based on the desired light out-put. Such determination can be readily made by the person of ordinary skill in the relevant art. For example, the ratio of quantum dots with different peak emissions that are used in an optical material is determined by the emission peaks of the quantum dots used. For example, when quantum dots capable of emitting green light having a peak center wavelength in a range from about 514 nm to about 545 nm, and any wavelength in between whether overlapping or not, and quantum dots capable of emitting red light having a peak center wavelength in a range from about 615 nm to about 645 nm, and any wavelength in between whether overlapping or not, are used in an optical material, the ratio of the weight percent green-emitting quantum dots to the weight percent of red-emitting quantum dots can be in a range from about 12:1 to about 1:1, and any ratio in between whether overlapping or not.

The above ratio of weight percent green-emitting quantum dots to weight percent red-emitting quantum dots in an optical material can alternatively be presented as a molar ratio. For example, the above weight percent ratio of green to red quantum dots can correspond to a green to red quantum dot molar ratio in a range from about 24.75 to 1 to about 5.5 to 1, and any ratio in between whether overlapping or not.

The ratio of the blue to green to red light output intensity in white trichomatic light emitted by a quantum dot containing BLU described herein including blue-emitting solid state inorganic semiconductor light emitting devices (having blue light with a peak center wavelength in a range from about 450 nm to about 460 nm, and any wavelength in between whether overlapping or not), and an optical material including mixtures of green-emitting quantum dots and red-emitting quantum dots within the above range of weight percent ratios, can vary within the range. For example, the ratio of blue to green light output intensity therefor can be in a range from about 0.75 to about 4 and the ratio of green to red light output intensity therefor can be in a range from about 0.75 to about 2.0. In certain embodiments, for example, the ratio of blue to green light output intensity can be in a range from about 1.4 to about 2.5 and the ratio of green to red light output intensity can be in a range from about 0.9 to about 1.3.

Scatterers, also referred to as scattering agents, within the scope of the invention may be present, for example, in an amount of between about 0.01 weight percent and about 1 weight percent. Amounts of scatterers outside such range may also be useful. Examples of light scatterers (also referred to herein as scatterers or light scattering particles)

that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the relevant art. The size and size distribution can be based upon the refractive index mismatch of the scattering particle and the host material in which the light scatterers are to be dispersed, and the preselected wavelength(s) to be scattered according to light scattering theory, e.g., Rayleigh or Mie scattering theory. The surface of the scattering particle may further be treated to improve dispensability and stability in the host material. In one embodiment, the scattering particle comprises $TiO_2$ (R902+ from DuPont) of 0.2 μm particle size, in a concentration in a range from about 0.01 to about 1% by weight.

The amount of scatterers in a formulation is useful in applications where the formulation which may be in the form of an ink is contained in a clear vessel having edges to limit losses due to the total internal reflection. The amount of the scatterers may be altered relative to the amount of quantum dots used in the formulation. For example, when the amount of the scatter is increased, the amount of quantum dots may be decreased.

Examples of thixotropes which may be included in a quantum dot formulation, also referred to as rheology modifiers, include, but are not limited to, fumed metal oxides (e.g., fumed silica which can be surface treated or untreated (such as Cab-O-Sil® fumed silica products available from Cabot Corporation), or fumed metal oxide gels (e.g., a silica gel). An optical material can include an amount of thixotrope in a range from about 5 to about 12 weight percent. Other amounts outside the range may also be determined to be useful or desirable.

In certain embodiments, a formulation including quantum dots and a host material can be formed from an ink comprising quantum dots and a liquid vehicle, wherein the liquid vehicle comprises a composition including one or more functional groups or units that are capable of being cross-linked. The functional units can be cross-linked, for example, by UV treatment, thermal treatment, or another cross-linking technique readily ascertainable by a person of ordinary skill in a relevant art. In certain embodiments, the composition including one or more functional groups that are capable of being cross-linked can be the liquid vehicle itself. In certain embodiments, it can be a co-solvent. In certain embodiments, it can be a component of a mixture with the liquid vehicle.

One particular example of a preferred method of making an ink is as follows. A solution including quantum dots having the desired emission characteristics well dispersed in an organic solvent is concentrated to the consistency of a wax by first stripping off the solvent under nitrogen/vacuum until a quantum dot containing residue with the desired consistency is obtained. The desired resin monomer is then added under nitrogen conditions, until the desired monomer to quantum dot ratio is achieved. This mixture is then vortex mixed under oxygen free conditions until the quantum dots are well dispersed. The final components of the resin are then added to the quantum dot dispersion, and are then sonicated mixed to ensure a fine dispersion.

A tube or capillary comprising an optical material prepared from such finished ink can be prepared by then introducing the ink into the tube via a wide variety of methods, and then UV cured under intense illumination for some number of seconds for a complete cure.

In certain aspects and embodiments of the inventions taught herein, the optic including the cured quantum dot containing ink is exposed to light flux for a period of time sufficient to increase the photoluminescent efficiency of the optical material.

In certain embodiments, the optical material is exposed to light and heat for a period of time sufficient to increase the photoluminescent efficiency of the optical material.

In preferred certain embodiments, the exposure to light or light and heat is continued for a period of time until the photoluminescent efficiency reaches a substantially constant value.

In one embodiment, for example, after the optic, i.e. tube or capillary, is filled with quantum dot containing ink, cured, and sealed (regardless of the order in which the curing and sealing steps are conducted), the optic is exposed, to 25-35 milliWatt (mW)/square centimeter ($cm^2$) light flux with a wavelength in a range from about 365 nm to about 470 nm, while at a temperature in a range from about 25 to 80° C., for a period of time sufficient to increase the photoluminescent efficiency of the ink. In one embodiment, for example, the light has a wavelength of about 450 nm, the light flux is 30 m Watts (W)/square centimeter ($cm^2$), the temperature 80° C., and the exposure time is 3 hours.

In general, quantum dots according to the present invention can have an average particle size in a range from about 1 to about 1000 nanometers (n), and preferably in a range from about 1 to about 100 nm. In certain embodiments, quantum dots have an average particle size in a range from about 1 to about 20 nm (e.g., such as about 5, 6, 7, 8, 9, 10, 11, 12, 13, 14, 15, 16, 17, 18, 19, or 20 nm). In certain embodiments, quantum dots have an average particle size in a range from about 1 nm to about 20 nm or about 1 nm to about 10 nm. Quantum dots can have an average diameter less than about 150 Angstroms (Å). In certain embodiments, quantum dots having an average diameter in a range from about 12 to about 150 Å can be particularly desirable. However, depending upon the composition, structure, and desired emission wavelength of the quantum dot, the average diameter may be outside of these ranges.

The particle size distribution of the quantum dots (including, e.g., semiconductor nanocrystals) can be further refined by size selective precipitation with a poor solvent for the quantum dots, such as methanol/butanol. For example, quantum dots can be dispersed in a solution of 10% butanol in hexane. Methanol can be added drop wise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected quantum dot (e.g., semiconductor nanocrystal) population preferably has no more than a 15% rms deviation from mean diameter, more preferably 10% rms deviation or less, and most preferably 5% rms deviation or less.

According to one aspect, a formulation or composition includes a host material that is photopolymerizable. The formulation or composition in the form of a fluid can be placed within the tube or other container and then one or both ends sealed with the tube being hermetically sealed to avoid oxygen being within a tube. Alternatively, the formulation or composition can be disposed between opposing plates and/or sheets with the perimeter edges being hermetically sealed. Quantum dots may be present in the polymerizable composition in an amount from about 0.05% w/w to about 5.0% w/w. According to one aspect, the polymerizable composition is photopolymerizable. The polymerizable composition is in the form of a fluid which can be placed within the tube and then one or both ends sealed with the tube being hermetically sealed to avoid oxygen being within the tube. The polymerizable composition is then subjected to light of sufficient intensity and for a period of time sufficient to polymerize the polymerizable composition, and in one aspect, in the absence of oxygen. In certain embodiments, the period of time can range between about 10 seconds to about 6 minutes or between about 1 minute to about 6 minutes. According to one embodiment, the period of time is sufficiently short to avoid agglomeration of the quantum dots prior to formation of a polymerized matrix. Agglomeration can result in FRET and subsequent loss of photoluminescent performance.

A host material can include a combination of one or more polymerizable host materials. A polymer or matrix in which quantum dots are dispersed is an example of a host material. Host materials include polymeric and non-polymeric materials that are at least partially transparent, and preferably fully transparent, to preselected wavelengths of light.

According to an additional aspect, a polymerizable host material is selected so as to provide sufficient ductility to the polymerized matrix. Ductility can be advantageous in relieving stress on thin walled glass tubes that can occur during polymer shrinkage when the polymer matrix is cured. Suitable polymerizable materials can act as solvents for the quantum dots and so combinations of polymerizable host materials can be selected based on solvent properties for various quantum dots.

Polymerizable host materials include monomers and oligomers and polymers and mixtures thereof. Exemplary monomers include lauryl methacrylate, norbornyl methacrylate, Ebecyl 150 (Cytec), CD590 (Cytec) and the like. Polymerizable materials can be present in the polymerizable formulation in an amount greater than 50 weight percent. Examples include amounts in a range greater than 50 to about 99.5 weight percent, greater than 50 to about 98 weight percent, greater than 50 to about 95 weight percent, from about 80 to about 99.5 weight percent, from about 90 to about 99.95 weight percent, from about 95 to about 99.95 weight percent. Other amounts outside these examples may also be determined to be useful or desirable.

Exemplary polymerizable compositions further include one or more of a crosslinking agent, a scattering agent, a rheology modifier, a filler, and a photoinitiator.

Suitable crosslinking agents include ethylene glycol dimethacrylate Ebecyl 150 and the like. Crosslinking agents can be present in the polymerizable formulation in an amount between about 0.5 wt % and about 30.0 wt %. In certain embodiments, crosslinking agents can be present in the polymerizable formulation in an amount between about 0.5 wt % and about 3.0 wt %. Crosslinking agents are generally added, for example in an amount of 1% w/w, to improve stability and strength of a polymer matrix which helps avoid cracking of the matrix due to shrinkage upon curing of the matrix.

Suitable scattering agents include $TiO_2$, alumina, barium sulfate, PTFE, barium titanate and the like. Scattering agents can be present in the polymerizable formulation in an amount between about 0.05 wt % and about 1.0 wt %. Scattering agents are generally added, for example in a preferred amount of about 0.15% w/w, to promote outcoupling of emitted light.

Suitable rheology modifiers (thixotropes) include fumed silica commercially available from Cabot Corporation such as TS-720 treated fumed silica, treated silica commercially available from Cabot Corporation such as TS720, TS500, TS530, TS610 and hydrophilic silica such as M5 and EHS commercially available from Cabot Corporation. Rheology modifiers can be present in the polymerizable formulation in an amount between about 5% w/w to about 12% w/w. Rheology modifiers or thixotropes act to lower the shrinkage of the matrix resin and help prevent cracking. Hydrophobic rheology modifiers disperse more easily and build viscosity at higher loadings allowing for more filler content and less shrinkage to the point where the formulation becomes too viscous to fill the tube. Rheology modifiers such as fumed silica also provide higher EQE and help to prevent settling of $TiO_2$ on the surface of the tube before polymerization has taken place.

Suitable fillers include silica, fumed silica, precipitated silica, glass beads, PMMA beads and the like. Fillers can be present in the polymerizable formulation in an amount between about 0.01% and about 60%, about 0.01% and about 50%, about 0.01% and about 40%, about 0.01% and about 30%, about 0.01% and about 20% and any value or range in between whether overlapping or not.

Suitable photoinitiators include Irgacure 2022, KTO-46 (Lambert), Esacure 1 (Lambert) and the like. Photoinitiators can be present in the polymerizable formulation in an amount between about 1% w/w to about 5% w/w. Photoinitiators generally help to sensitize the polymerizable composition to UV light for photopolymerization.

Additional information that may be useful in connection with the present invention and the inventions described herein is included in International Application No. PCT/US2009/002796 of Coe-Sullivan et al, filed 6 May 2009, entitled "Optical Components, Systems Including An Optical Component, And Devices"; International Application No. PCT/US2009/002789 of Coe-Sullivan et al, filed 6 May 2009, entitled "Solid State Lighting Devices Including Quantum Confined Semiconductor Nanoparticles, An Optical Component For A Solid State Light Device, And Methods"; International Application No. PCT/US2010/32859 of Modi et al, filed 28 Apr. 2010 entitled "Optical Materials, Optical Components, And Methods"; International Application No. PCT/US2010/032799 of Modi et al, filed 28 Apr. 2010 entitled "Optical Materials, Optical Components, Devices, And Methods"; International Application No. PCT/US2011/047284 of Sadasivan et al, filed 10 Aug. 2011 entitled "Quantum Dot Based Lighting"; International Application No. PCT/US2008/007901 of Linton et al, filed 25 Jun. 2008 entitled "Compositions And Methods Including Depositing Nanomaterial"; U.S. patent application Ser. No. 12/283,609 of Coe-Sullivan et al, filed 12 Sep. 2008 entitled "Compositions, Optical Component, System Including An Optical Component, Devices, And Other Products"; each of the foregoing being hereby incorporated herein by reference in its entirety.

In accordance with a still further aspect of the present invention, there is provided a composition including at least one quantum dot described herein. In certain embodiments of the composition, the solid state photoluminescence efficiency of the composition is at least 80% at a temperature of 90° C. or above. In certain embodiments of the composition, the solid state photoluminescence efficiency of the composition at a temperature of 90° C. or above is at least 95% of the solid state photoluminescence efficiency of the composition at 25° C. In certain embodiments, the composition further includes a host material.

In accordance with a still further aspect of the present invention, there is provided an optical material comprising at least one quantum dot described herein.

In accordance with a still further aspect of the present invention, there is provided a light emitting material comprising at least one quantum dot described herein.

In accordance with a still further aspect of the present invention, there is provided an optical component including at least one quantum dot described herein.

In accordance with a still further aspect of the present invention, there is provided a backlighting unit including at least one quantum dot described herein.

In accordance with a still further aspect of the present invention, there is provided a display including at least one quantum dot described herein.

In accordance with a still further aspect of the present invention, there is provided an electronic device including at least one quantum dot described herein.

In accordance with a still further aspect of the present invention, there is provided an opto-electronic device including at least one quantum dot described herein.

In accordance with a still further aspect of the present invention, there is provided a light-emitting device including at least one quantum dot described herein.

In accordance with a still further aspect of the present invention, there is provided a lamp including at least one quantum dot described herein.

In accordance with a still further aspect of the present invention, there is provided a light bulb including at least one quantum dot described herein.

In accordance with a still further aspect of the present invention, there is provided a luminaire including at least one quantum dot described herein.

In accordance with yet another aspect of the present invention, there is provided a population of quantum dots including at least on quantum dot described herein. In certain embodiments, the light emitted by the population has a peak emission at a predetermined wavelength with an FWHM less than about 60 nm. In certain embodiments, the FWHM is in a range from about 15 to about 50 nm.

In accordance with yet another aspect of the present invention, there is provided a population of quantum dots prepared in accordance with any of the methods described herein. In certain embodiments, the light emitted by the population has a peak emission at a predetermined wavelength with an FWHM less than about 60 nm. In certain embodiments, the FWHM is in a range from about 15 to about 50 nm.

In accordance with a still further aspect of the present invention, there is provided a composition including at least one quantum dot prepared in accordance with any of the methods described herein. In certain embodiments of the composition, the solid state photoluminescence efficiency of the composition is at least 80% at a temperature of 90° C. or above. In certain embodiments of the composition, the solid state photoluminescence efficiency of the composition at a temperature of 90° C. or above is at least 95% of the solid state photoluminescence efficiency of the composition at 25° C. In certain embodiments, the composition further includes a host material.

In accordance with a still further aspect of the present invention, there is provided an optical material comprising at least one quantum dot prepared in accordance with any of the methods described herein.

In accordance with a still further aspect of the present invention, there is provided a light emitting material comprising at least one quantum dot prepared in accordance with any of the methods described herein.

In accordance with a still further aspect of the present invention, there is provided an optical component including at least one quantum dot prepared in accordance with any of the methods described herein.

In accordance with a still further aspect of the present invention, there is provided a backlighting unit including at least one quantum dot prepared in accordance with any of the methods described herein.

In accordance with a still further aspect of the present invention, there is provided a display including at least one quantum dot prepared in accordance with any of the methods described herein.

In accordance with a still further aspect of the present invention, there is provided an electronic device including at least one quantum dot prepared in accordance with any of the methods described herein.

In accordance with a still further aspect of the present invention, there is provided an opto-electronic device including at least one quantum dot prepared in accordance with any of the methods described herein.

In accordance with a still further aspect of the present invention, there is provided a light-emitting device including at least one quantum dot prepared in accordance with any of the methods described herein.

In accordance with a still further aspect of the present invention, there is provided a lamp including at least one quantum dot prepared in accordance with any of the methods described herein.

In accordance with a still further aspect of the present invention, there is provided a light bulb including at least one quantum dot prepared in accordance with any of the methods described herein.

In accordance with a still further aspect of the present invention, there is provided a luminaire including at least one quantum dot prepared in accordance with any of the methods described herein.

In certain embodiments of the various aspects and embodiments of the inventions described herein, the quantum dot core and shells are undoped.

In certain embodiments of the various aspects and embodiments of the inventions described herein, a quantum dot described herein can be included in a device, component, or product in the form of a composition in which it is included.

The present invention will be further clarified by the following examples, which are intended to be exemplary of the present invention.

Example I

Coating Core Quantum Dots Using a Coating Process without Amine Species to Produce a Green Emitter Preparation of semiconductor nanocrystals capable of emitting green light are prepared with oleic acid as follows in the absence of amine species.

Synthesis of CdSe Cores:

262.5 mmol of cadmium acetate is dissolved in 3.826 mol of tri-n-octylphosphine at 100° C. in a 3 L 3-neck round-bottom flask and then dried and degassed for one hour. 4.655 mol of trioctylphosphine oxide and 599.16 mmol of octadecylphosphonic acid are added to a 5 L stainless steel reactor and dried and degassed at 140° C. for one hour. After degassing, the Cd solution is added to the reactor containing the oxide/acid and the mixture is heated to 310° C. under nitrogen. Once the temperature reached 310° C., the heating mantle is removed from the reactor and 731 mL of 1.5 M diisobutylphosphine selenide (DIBP-Se) (900.2 mmol Se) in 1-Dodecyl-2-pyrrolidinone (NDP) is then rapidly injected. The reactor is then immediately submerged in a partially frozen (via liquid nitrogen) squalane bath rapidly reducing the temperature of the reaction to below 100° C. The first absorption peak of the nanocrystals is 480 nm. The CdSe cores are precipitated out of the growth solution inside a nitrogen atmosphere glovebox by adding a 3:1 mixture of methanol and isopropanol. The isolated cores are then dissolved in hexane and used to make core-shell materials. The isolated material specifications are as follows: Optical Density @ 350 nm=1.62; Abs=486 nm; Emission=509 nm; FWHM=38 nm; Total Volume=1.82 L of hexane.

Synthesis of CdSe/ZnS/CdZnS Core-Shell Nanocrystals:

335 mL of octadecene (ODE), 68.4 mmol of zinc acetate, and 38 mL of oleic acid are loaded into a 1 L glass reactor and degassed at 100° C. for 1 hour. In a 1 L 3-neck flask, 100 mL of ODE is degassed at 120° C. for 1 hour. After degassing, the temperature of the flask is reduced to 65° C. and then 23.08 mmol of CdSe cores from the procedure above (275 mL) are blended into the 100 mL of degassed ODE and the hexane is removed under reduced pressure. The temperature of the reactor is then raised to 310° C. In a glove box, the core/ODE solution and 40 mL of octanethiol are added to a 180 or 360 mL container. In a 600 mL container, 151 mL of 0.5 M Zinc Oleate in TOP, 37 mL of 1.0 M Cadmium Oleate in TOP, and 97 mL of 2 M TOP-S are added. Once the temperature of the reactor hit 310° C., the ODE/QD cores/Octanethiol mixture is injected into the reactor and allowed to react for 30 min at 300° C. After this reaction period, the Zn(Oleate)$_2$/Cd(Oleate)$_2$/TOP-S mixture is injected to the reactor and the reaction is allowed to continue for an additional 30 minutes at which point the mixture is cooled to room temperature. The resulting core-shell material is precipitated out of the growth solution inside a nitrogen atmosphere glovebox by adding a 2:1 mixture of butanol and methanol. The isolated quantum dots (QDs) are then dissolved in toluene and precipitated a second time using 2:3 butanol:methanol. The QDs are finally dispersed in toluene. The isolated material specifications are as follows: Optical Density (OD) @ 450 nm=0.316; Abs=501 nm; Emission=518 nm; FWHM=38 nm; Solution QY=60; Film EQE=93%.

Example II

Coating Core Quantum Dots Using a Coating Process without Amine Species to Produce a Red Emitter Synthesis of CdSe/ZnS/CdZnS Core-Shell Nanocrystals:

In a typical reaction, a red core with a first absorbance peak at 565 nm (5.19 mL, 0.50 mmol Cd) is mixed in a reaction vessel with 1-octadecene (4.63 mL), and Zn(Oleate)$_2$ (0.5M, 1.68 mL). The reaction vessel is heated to 120 C and vacuum is applied for 15 min. The reaction vessel is back-filled with nitrogen and heated to 310 C. The temperature ramp, is between 1° C./5 seconds and 1° C./15 seconds. Once the vessel reaches 300 C, octanethiol (0.73 mL) is swiftly injected and a timer is started. Once the timer reaches 2 min, one syringe containing Zn(Oleate)$_2$ (0.5M, 3.26 mL) and Cd(Oleate)$_2$ (1M, 2.66 mL), and another syringe containing octanethiol (2.74 mL) are swiftly injected. Once the timer reaches 30 min, the heating mantle is dropped and the reaction cooled by subjecting the vessel to a cool air flow. The final material is precipitated via the addition of butanol (20 mL) and methanol (5 mL), centrifuged at 3000 RCF for 2 min, and the pellet redispersed into hexanes (3 mL). The sample is then precipitated once more via the addition of butanol (3 mL), and methanol (1 mL), centrifuged, and dispersed into toluene for storage (1.0 g of core/shell material, 615-618 nm emission, 25 nm FWHM, >90% EQE in film).

Example III

Synthesis of CdSe Cores:

The following are added to a 1 L glass reaction vessel: trioctylphosphine oxide (9.69 g), 1-octadecene (ODE, 141.92 g), and 1-octadecylphosphonic acid (1.182 g, 3.54 mmol). The vessel is subjected to 3 cycles of vacuum/nitrogen at 120° C., and the temperature is raised to 270° C. under nitrogen. At 270° C., a solution of 0.25M diisobutylphosphine selenide in trioctylphosphine (DIBP-Se in TOP, 11.03 mL, 2.76 mmol), and a solution of 0.25M cadmium oleate (14.14 mL, 3.54 mmol) are rapidly and simultaneously injected, within a period of less than 1 second, followed by injection of ODE (76.0 mL) to rapidly drop the temperature to about 240° C. resulting in the production of quantum dots with an initial absorbance peak between 420-430 nm. 5-20 seconds after the ODE injection, a solution of Cd(oleate)$_2$ (0.5M in a 50/50 v/v mixture of TOP and ODE) is continuously introduced along with a solution of DMP-Se (0.45M in a 50/50 v/v mixture of trioctylphosphine and ODE) at a rate of 11.7 mL/hr. The infusion rate is increased according to the following schedule: 23.3 mL/hr at 15 min; 35.0 mL/hr at 25 min; 46.7 mL/hr at 35 min; 62.2 mL/hr at 45 min; 83.0 mL/hr at 55 min; and 110.6 mL/hr at 65 min. A total of 133.5 mL of each precursor is delivered while the temperature of the reactor is maintained between 205-240° C. At the end of the infusion, the reaction vessel is cooled rapidly using a flow of air to bring the temperature down to <150° C. (within 10 min). The final material is used as is without further purification (First absorbance peak: 596 nm, Total volume: 553 mL, Reaction yield: 99%). The absorption spectra for the core is shown in FIG. 1A.

Figure 1B:
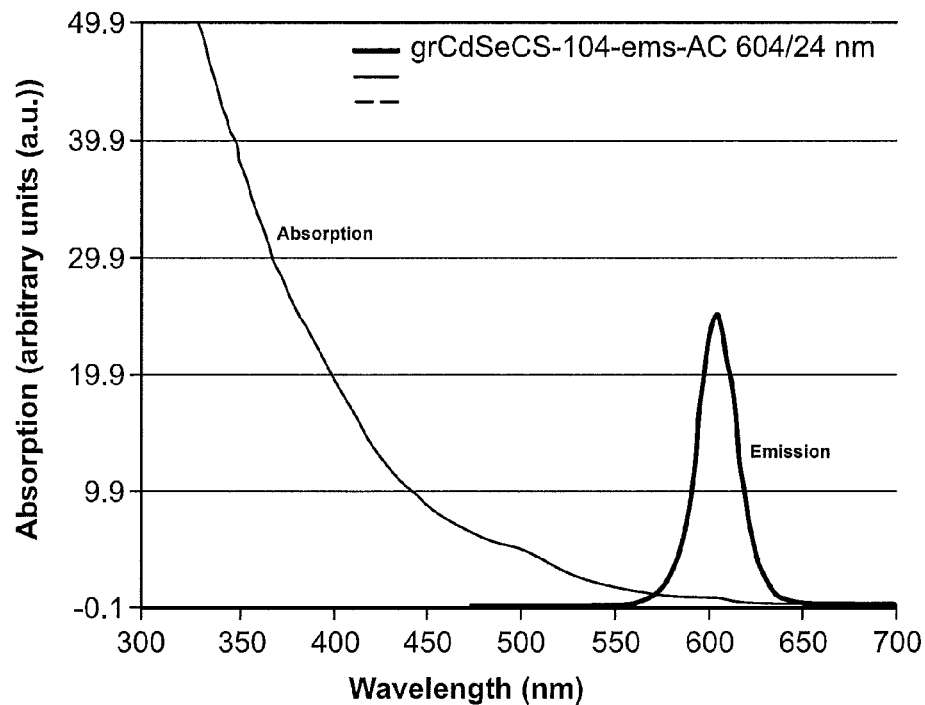
FIG. 1B graphically illustrates the absorption and emission spectra of CdSe/ZnSe/CdZnS referred to in Example III.

Synthesis of CdSe/ZnSe/CdZnS Core/Shell/Shell):

The CdSe core synthesized from above, with a first absorbance peak of 596 nm (42.65 mL, 5.0 mmol Cd), is mixed with 1-octadecene (ODE, 60 mL) and Zinc Oleate (0.5M, 45.62 mL). The solution is degassed at 110° C. for 10 min, and then refilled with N$_2$. The temperature is set to 320° C., upon which a solution of diisobutylphosphine selenide in N-dodecylpyrrolidone (DIBP-Se in NDP, 1.0M, 19.16 mL) mixed with ODE (44.71 mL) is infused at a rate of 186.5 mL/hr for 15 min. The temperature is kept between 320-330° C. during this infusion stage. At the end of the 15 min infusion, the solution is annealed at 320-330° C. for 5 min, followed by infusion of the shell 2 precursors. The shell 2 precursors consist of 1) Cadmium oleate (1M, 31.0 mL) mixed with Zinc oleate (0.5M, 119.7 mL), and 2) dodecanethiol (67.3 mL) mixed with ODE (66.9 mL) and TOP (16.7 mL). A total of 150.7 mL of each precursor is infused over 30 min. The temperature is kept between 315-325° C. during this infusion. At the end of the infusion, the solution is annealed for 5 min at 315-325° C., followed by cooling with an air flow down to <150° C. within 10 min. The final core/shell material is precipitated twice via the addition of butanol and methanol at a 2:1 ratio v/v followed by redispersion into toluene for storage (Emission 605 nm, FWHM 25 nm, Film EQE at RT: 96%, Film EQE at 140° C.: 96%). The absorption spectra for the CdSe/ZnSe/CdZnS quantum dot of this Example is shown in FIG. 1B.

Example IV

Semiconductor Nanocrystals Capable of Emitting Red Light

Figure 2A:
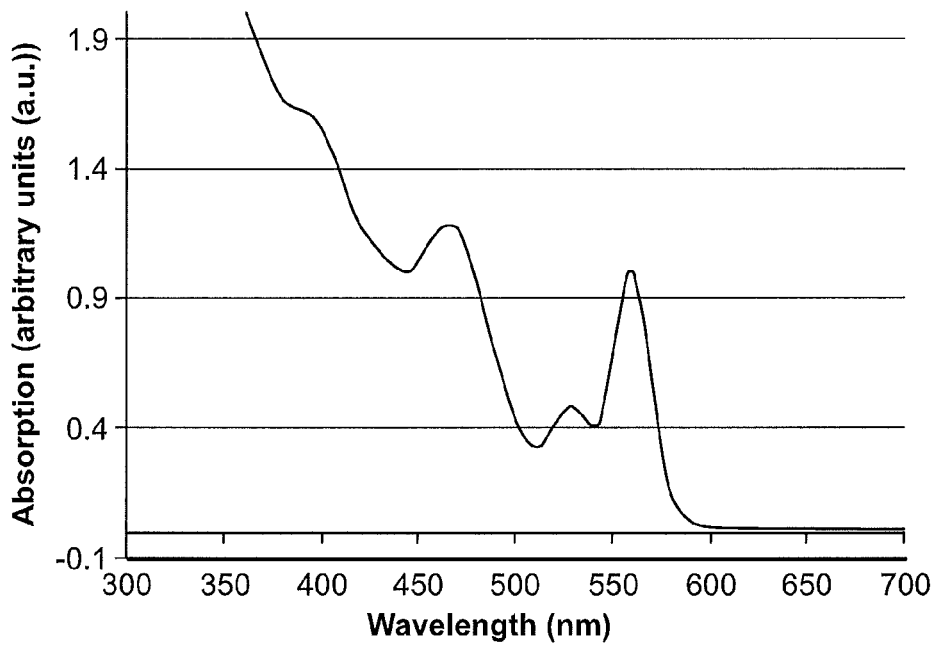
FIG. 2A graphically illustrates the absorption spectrum of the CdSe core material referred to in Example IV.

Synthesis of CdSe Cores: The following are added to a 1 L glass reaction vessel: trioctylphosphine oxide (17.10 g), 1-octadecene (181.3 g), 1-octadecylphosphonic acid (2.09, 24.95 mmol), and Cd(Oleate)$_2$ (1 M solution in trioctylphosphine, 24.95 mL, 24.95 mmol). The vessel is subjected to 3 cycles of vacuum/nitrogen at 120° C., and the temperature is raised to 270° C. under nitrogen. At 270° C., a solution of 1 M diisobutylphosphine selenide in N-dodecylpyrrolidone (DIBP-Se,19.46 mL, 19.46 mmol) is rapidly injected, within a period of less than 1 second, followed by injection of 1-octadecene (76.6 mL) to rapidly drop the temperature to about 240° C. resulting in the production of quantum dots with an initial absorbance peak between 420-450 nm 5-20 seconds after the ODE quench, a solution of Cd(oleate)$_2$ (0.5 M in a 50/50 v/v mixture of TOP and ODE) is continuously introduced along with a solution of DIBP-Se (0.4 M in a 60/40 v/v mixture of N-dodecylpyrrolidone and ODE) at a rate of 61.7 mL/hr. At 15 min, the infusion rate is increased to 123.4 mL/hr. At 25 min, the infusion rate is increased to 185.2 mL/hour. At 35 min, the infusion rate is increased to 246.9 mL/hr. At 45 min, the infusion rate is increased to 329.2 mL/hr. A total of 136.8 mL of each precursor is delivered while the temperature of the reactor is maintained between 215-240° C. At the end of the infusion, the reaction vessel is cooled using room temperature airflow over a period of 5-15 min. The final material is used as is without further purification (First absorbance peak: 559 nm, Total volume: 587 mL, Reaction yield: 99%). The absorption spectrum of the core is shown in FIG. 2A.

Figure 2B:
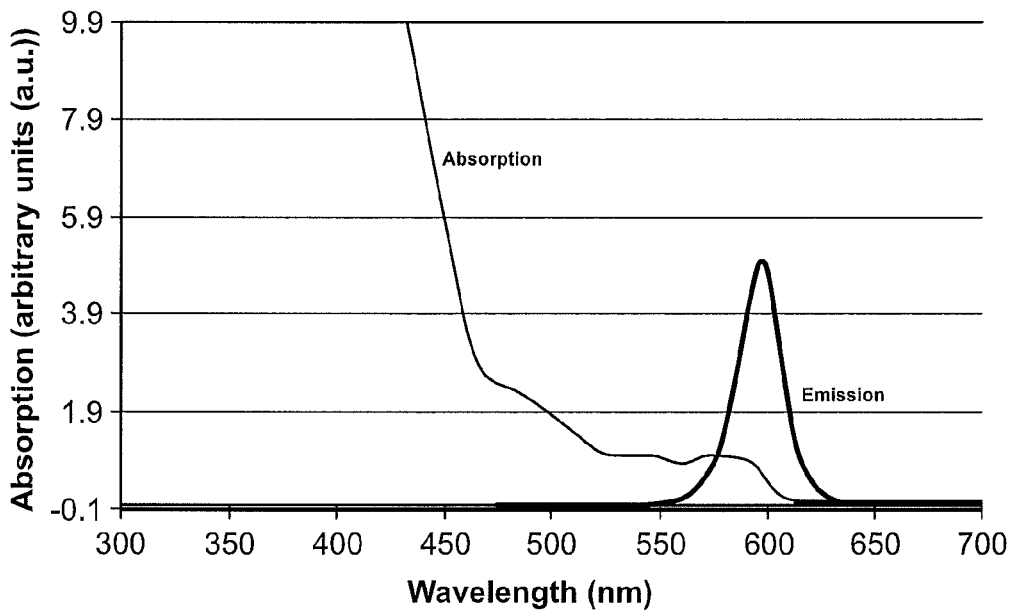
FIG. 2B graphically illustrates the absorption and emission spectra of CdSe/ZnS/CdZnS referred to in Example IV.

Synthesis of CdSe/ZnS/CdZnS Core/Shell/Shell:

CdSe cores synthesized as described in the preceding paragraph, with a first absorbance peak of 559 nm (72.9 mL, 8 mmol Cd), is mixed with Zn(Oleate)$_2$ (44.0 mL, 0.5 M in TOP) and 1-octadecene (84.1 mL). The solution is heated to 320° C., upon which a syringe containing 1-dodecanethiol (39.54 mL) is swiftly injected. After 2 min, when the temperature recovers to 310-315° C., the overcoat precursors are delivered via a syringe pump over a period of 30 min. The two overcoating precursor stocks consist of the following: 1) Zn(Oleate)$_2$ (53.87 mL, 0.5 M in TOP) mixed with Cd(Oleate)$_2$ (64.64 mL, 1.0 M in TOP), and 2) dodecanethiol (33.69 mL) mixed with 1-octadecene (67.86 mL) and TOP (16.96 mL). During the overcoating precursor infusion, the temperature is kept between 320° C.-330° C. Any volatiles from the system are allowed to distill over and leave the system in order for the temperature to reach 320-330° C. After the infusion ended, the sample is annealed for 5 min at 320-330° C. and cooled to room temperature over a period of 5-15 min. The final core/shell material is precipitated via the addition of butanol and methanol at a 2:1 ratio v/v. The pellet is isolated via centrifugation, and redispersed into toluene (10 mL) for storage (Emission 598 nm, FWHM 24 nm, Film EQE at RT: 99%, Film EQE at 140° C.: 90-94%). The absorption and emission spectrum are shown in FIG. 2B.

Example V

Preparation of Ink Composition & Films

The following describes preparation of an ink formulation including semiconductor nanocrystals and preparation of a film from such ink formulation.

Example VA

Preparation of Ink Formulation 10 mg of semiconductor nanocrystals (inorganic mass as determined via thermal gravimetric analysis (TGA)) in toluene is added to 1.0 mL of Ebecyl 150 and degassed under reduced pressure to remove the toluene and oxygen. Once the toluene is removed, three purge and N$_2$ back-fill cycles are completed and then 10 mg of TiO$_2$ (1% by weight) is added to the formulation and the mixture is degassed under reduced pressure while stirring in order to disperse the TiO$_2$. Once these steps are completed, 1 drop (~12 mg) of Irgacure 2022 is added to the formulation and the mixture is stirred under air for a few minutes. The formulation is then ready for film preparation.

Example VB

Preparation of Film

A film prepared from an ink formulation prepared as generally described in Example VA is prepared as follows. ~5-10 µL of the formulation is dropped onto a 15 mm diameter borosilicate glass disc (~230+/−20 um in thickness). A second 15 mm disk is set on top of the drop of formulation sandwiching the ink between the glass slides. Care is taken to minimize the amount of ink at the edges that is not completely sandwiched by the glass slides. The sandwich is then brought into a N$_2$ purge box and inserted into a UV curing station (Dymax 5000-EC Series UV Curing Flood Lamp System) and cured with the following curing conditions: Dymax Metal Halide "D" Bulb; Part #38560; 80-100 mW/cm$^2$ excitation power with a cure time of 10 seconds. Once the film is cured, the films are then irradiated with 25 mW/cm$^2$ of 450 nm LED light while on a hot plate set at 50° C. for 12-18 hrs. (Alternatively, the samples can be irradiated with approximately 100 mW/cm$^2$ of 450 nm LED light while on a hot plate set at 80° C. for 1 hour). After this process, the EQE of the film is measured in a QEMS (Labsphere product) integrating sphere system. The films are then ready for temperature dependent efficiency measurements.

Example VC

PL vs. Temperature Measurement Protocol

With the room temperature (25° C.) EQE measured in an integrating sphere (Example VB), the sample is then measured on a hotplate at room temperature. The measurement involves optically exciting the sample at a wavelength shorter than the band edge absorption of the QDs (i.e. 1$^{st}$ excitonic absorption feature) and collecting both a portion of the PL emission from the sample as well as a portion of the excitation light after it interacts with the sample (this light is proportional to the absorption of the sample). The sample temperature is then raised via the hotplate and equilibrated at an elevated temperature for ~1 min (the temperature should not rise slower than 10° C./min) and the sample is then measured again. This process is repeated for multiple temperatures between 25° C. and about 140° C. or above. Measurements can be at preselected temperature intervals, e.g., at every 5, 10, or 20 degree intervals. Other intervals can be selected. The samples are heated and the measurements taken in the absence of oxygen. For each data point, the sample is held at a given temperature for about <~1-2 minutes when PL is measured. The EQE measurements were made using a 440 nm laser light source. Other adequate light sources include 405 nm laser or blue (405 and 440-450 nm) LED light sources. Monochromatic light from a white light monochromator can also be used. The light source should excite the sample with a flux/power density no greater than 100 mW/cm$^2$. Preferably, the excitation power density used to measure the sample is lower than that used to expose the sample prior to room temperature EQE measurement (as described in preparation of the film, Example VB). The optical path of the system (both excitation light and emitted semiconductor nanocrystal light) is not altered during data collection.

Example VI

Figure 4:
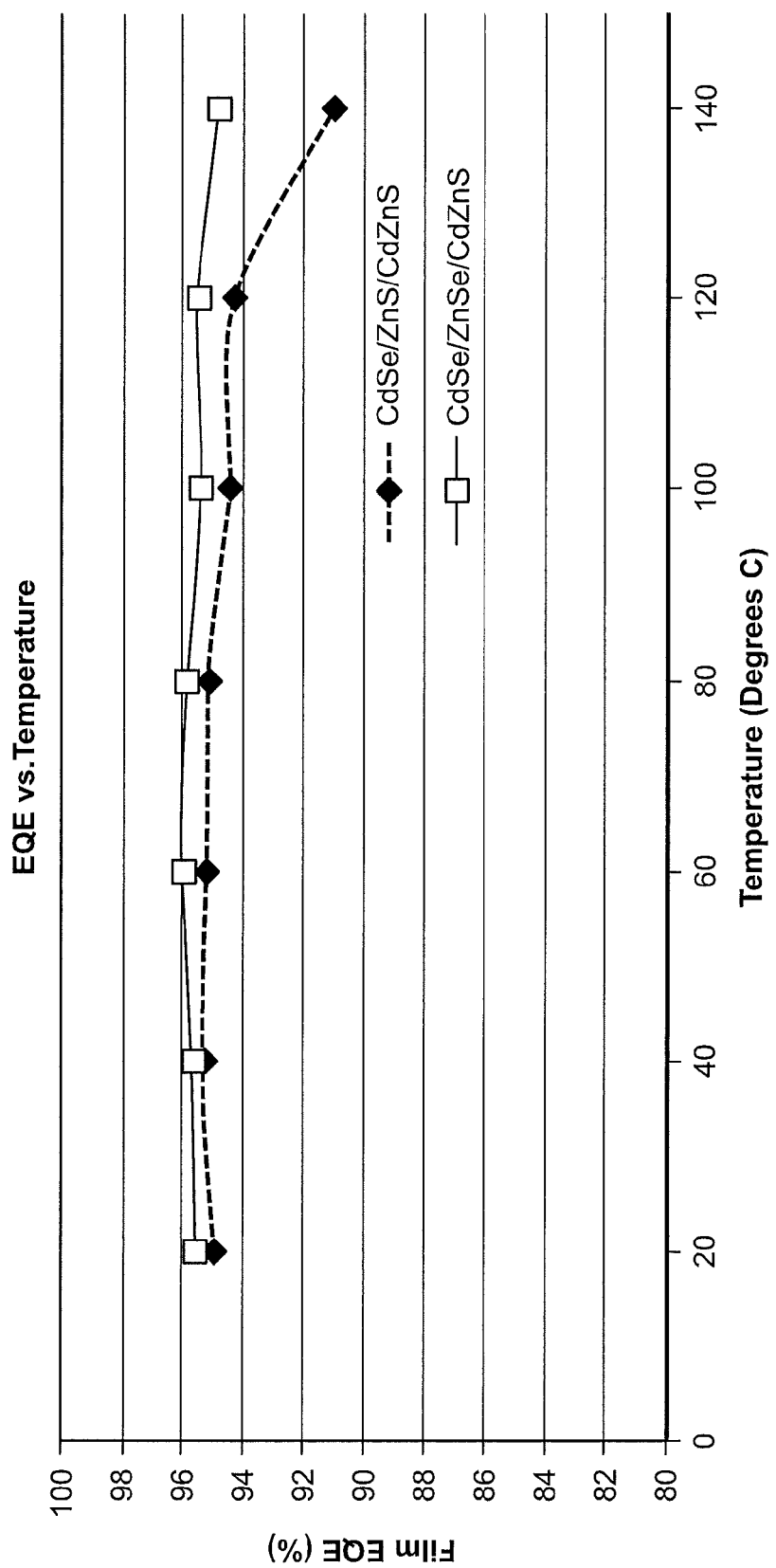
FIG. 4 graphically illustrates Film EQE (%) as a function of temperature (degrees C.) for sample films prepared with the semiconductor nanocrystals prepared generally in accordance with the procedures described in Examples III and IV.

FIG. 4 graphically depicts the calculated EQE values for the respective samples as a function of temperature. The EQE data presented in FIG. 4 are calculated based on the integrated PL change with temperature and correlated back to the room temperature (RT) EQE for the film. The integrated PL at RT is set equal to the RT measured EQE and therefore any change in PL is then an equivalent % change in EQE with adjustment for any absorption change at elevated temperatures.

Figure 5:
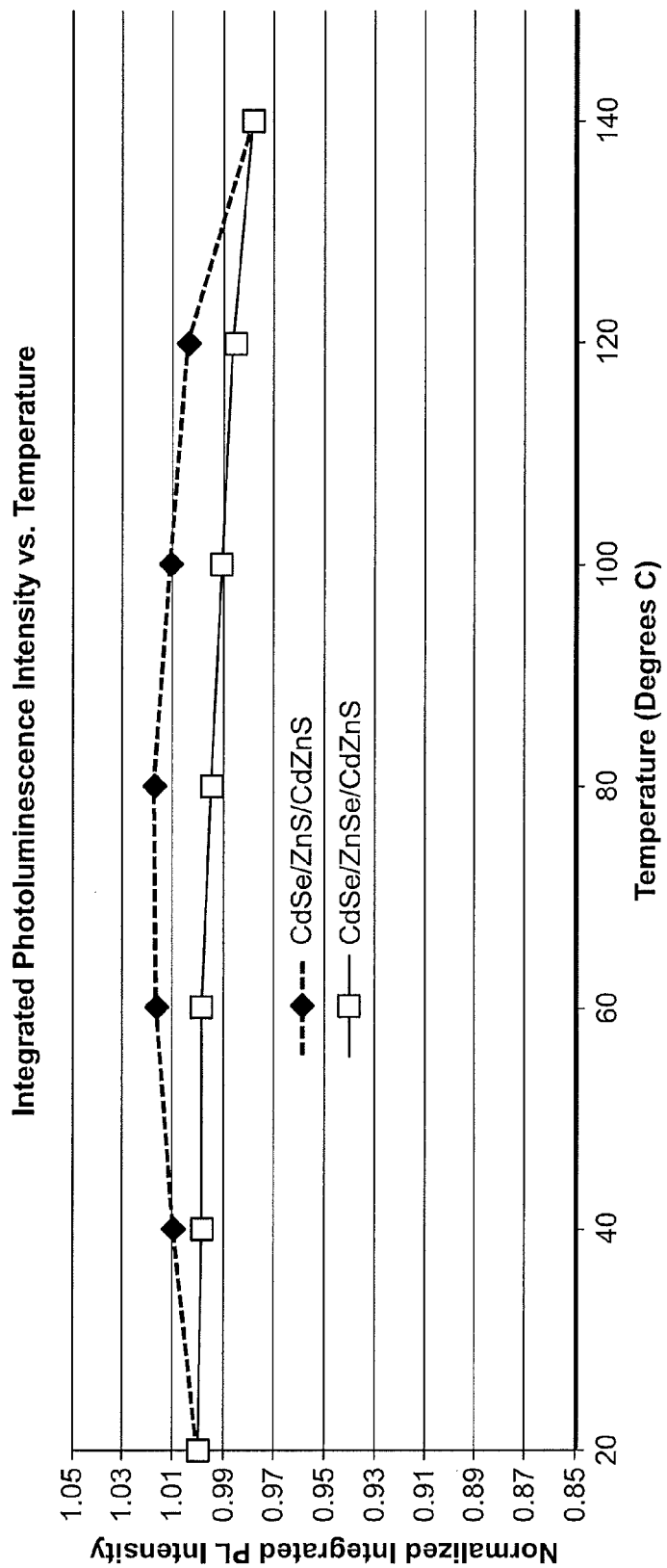
FIG. 5 graphically illustrates normalized integrated photoluminescence intensity as a function of temperature (degrees C.) for sample films prepared with the semiconductor nanocrystals prepared generally in accordance with the procedures described in Examples III and IV.

The PL data shown in FIG. 5 and the EQE data presented in FIG. 4 are based on sample films prepared with the semiconductor nanocrystals of the invention (the film being prepared as generally described in Example V) with nanocrystals prepared generally in accordance with the procedure described in Examples III (CdSe/ZnSe/CdZnS—red) and Example IV (CdSe/ZnS/CdZnS—red).

While not wishing to be bound by theory, this illustrates a reduction in the quenching of semiconductor nanocrystal emission as a function of temperature (also referred to as "thermal quenching".)

Figure 6A:
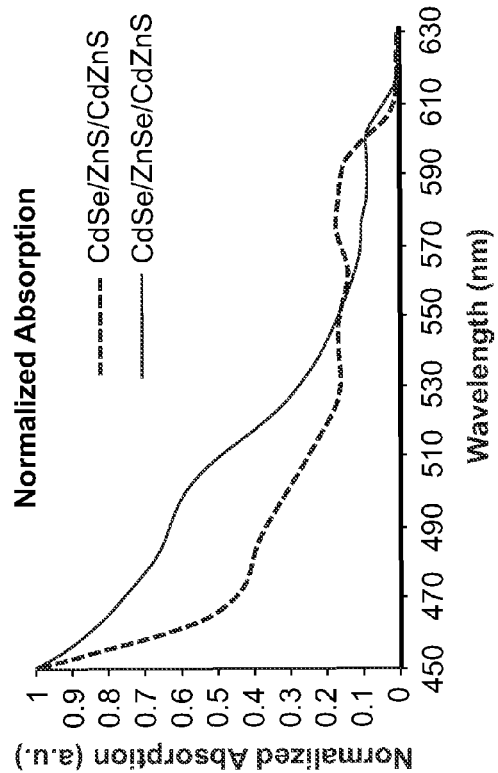
FIG. 6A and FIG. 6B graphically illustrate normalized integrated plots of absorption versus wavelength for semiconductor nanocrystals in accordance with the present invention, prepared generally in accordance with Examples III and IV.
Figure 6B:
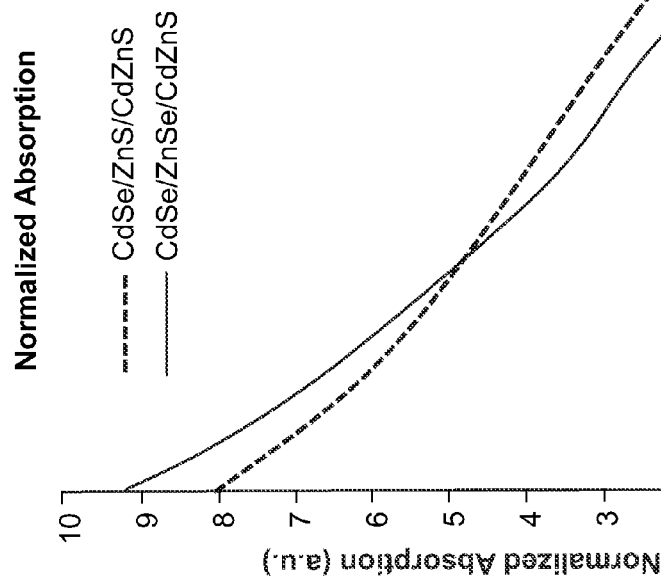

This result is further illustrated for the same samples in FIG. 6A and FIG. 6B as a normalized integrated plot of absorption versus wavelength for semiconductor nanocrystals in accordance with the present invention, prepared generally in accordance with Examples III and IV.

For assessing the EQE vs. temperature response of a semiconductor nanocrystal sample, a relative EQE measurement can be performed whereby the $\Sigma_{PL}$ values can be correlated back to the room temperature or starting EQE (EQE can be measured using DeMello's method in an integrating sphere). In other words, the $\Sigma_{PL}$ at room temp is set equal to the room temp EQE, and then the % drop in $\Sigma_{PL}$ at elevated temperatures, equates to an equivalent % drop from the room temperature EQE value. ($\Sigma_{PL}$ at RT is also referred to herein as $I_o$, and $\Sigma_{PL}$ at temperature T is also referred to herein as I(T).)

"Solid state external quantum efficiency" (also referred to herein as "EQE" or "solid state photoluminescent efficiency) can be measured in a 12" integrating sphere using a NIST traceable calibrated light source, using the method developed by Mello et al., Advanced Materials 9(3):230 (1997), which is hereby incorporated by reference. Such measurements can also be made with a QEMS from LabSphere (which utilizes a 4 in sphere; e.g. QEMS-2000: World Wide Website laser2000.nl/upload/documenten/fop_21-en2.pdf).

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:
1. A quantum dot comprising:
  a core quantum dot;
  a first semiconductor shell consisting of ZnS or ZnSe; and
  a second semiconductor shell comprising a second semiconductor material over the first semiconductor shell,
    wherein the second semiconductor material is different from the first semiconductor shell,
    the second semiconductor material comprises a ternary or quaternary alloy of a Group II-VI compound,
    wherein the core quantum dot comprises a material different from the first semiconductor shell,
    wherein the quantum dot is substantially free of an amine species, and
    wherein the quantum dot is characterized by having a solid state photoluminescence external quantum efficiency at a temperature of 90° C. or above that is at least 95% of the solid state photoluminescence external quantum efficiency of the quantum dot at 25° C.

2. The quantum dot of claim 1, wherein the quantum dot comprises a third shell comprising a third semiconductor material, wherein the third shell has a bandgap that is the same as or greater than that of the first shell and the second shell has a bandgap that is less than that of the first shell.

3. The quantum dot of claim 1, wherein the core quantum dot comprises a Group III-V semiconductor material.

4. The quantum dot of claim 1 wherein the ternary or quaternary alloy of a Group II-VI compound comprises $Cd_xZn_{1-x}S$ wherein $0<x<1$.

5. The quantum dot of claim 2 wherein the first semiconductor shell has a thickness from about 1 to about 20 monolayers.

6. The quantum dot of claim 1 wherein the second semiconductor shell has a thickness from about 1 to about 25 monolayers.

7. The quantum dot of claim 4 wherein the second semiconductor shell has a thickness from about 1 to about 25 monolayers.

8. Quantum dots comprising a quantum dot core with a first coating consisting of a zinc chalcogenide on an outer surface of the quantum dot core and an outermost coating comprising a second semiconductor material,
wherein the zinc chalcogenide is ZnS or ZnSe,
wherein the second semiconductor material is different from the zinc chalcogenide of the first coating,
wherein the quantum dot core comprises a material different from the first coating,
the second semiconductor material comprises a ternary or quaternary alloy of a Group II-VI compound,
wherein the outermost coating is substantially free of amine species,
wherein the quantum dots are characterized by having a solid state photoluminescence external quantum efficiency at a temperature of 90° C. or above that is at least 95% of the solid state photoluminescence external quantum efficiency of the quantum dot at 25° C.

9. The quantum dots of claim 8 wherein the outermost coating comprises a semiconductor material comprising $Cd_xZn_{1-x}S$ wherein $0<x<1$.

10. A quantum dot comprising a core comprising cadmium and selenium, a first shell consisting of a zinc chalcogenide disposed over the core; and a second shell comprising a second semiconductor material disposed over the first shell, wherein the zinc chalcogenide is ZnS or ZnSe, wherein the second shell comprises a semiconductor material represented by the formula $Cd_xZn_{1-x}S$ wherein $0<x<1$, wherein the second semiconductor material is different from the zinc chalcogenide of the first shell, wherein the quantum dot core comprises a material different from the first shell, and wherein the second shell is substantially free of amine species, wherein the quantum dot is characterized by having a solid state photoluminescence external quantum efficiency at a temperature of 90° C. or above that is at least 95% of the solid state photoluminescence external quantum efficiency of the quantum dot at 25° C.

11. The quantum dot of claim 10 wherein the quantum dot comprises a third shell comprising a third semiconductor material, wherein the third shell has a bandgap that is the same as or greater than that of the first shell and the second shell has a bandgap that is less than that of the first shell.

12. A quantum dot comprising a core comprising cadmium and selenium, a first shell consisting of ZnS disposed over the core; and a second shell comprising a second semiconductor material disposed over the first shell, wherein the second shell comprises a semiconductor material represented by the formula $Cd_xZn_{1-x}S$ wherein $0<x<1$, wherein the first shell is substantially free of amine species, wherein the second shell is substantially free of amine species, wherein the quantum dot is characterized by having a solid state photoluminescence external quantum efficiency at a temperature of 90° C. or above that is at least 95% of the solid state photoluminescence external quantum efficiency of the quantum dot at 25° C.

13. The quantum dot of claim 12 wherein the quantum dot comprises a third shell comprising a third semiconductor material, wherein the third shell has a bandgap that is the same as or greater than that of that first shell and the second shell has a bandgap that is less than that of the first shell.

14. A quantum dot comprising a core comprising cadmium and selenium, a first shell consisting of ZnSe disposed over the core; and a second shell comprising semiconductor material disposed over the first shell, wherein the second shell comprises a semiconductor material represented by the formula $Cd_xZn_{1-x}S$ wherein $0<x<1$, wherein the first shell is substantially free of amine species, wherein the second shell is substantially free of amine species, wherein the quantum dot is characterized by having a solid state photoluminescence external quantum efficiency at a temperature of 90° C. or above that is at least 95% of the solid state photoluminescence external quantum efficiency of the quantum dot at 25° C.

15. The quantum dot of claim 14 wherein the quantum dot comprises a third shell comprising a third semiconductor material, wherein the third shell has a bandgap that is the same as or greater than that of the first shell and the second shell has a bandgap that is less than that of the first shell.

16. The quantum dots of claim 8 wherein the first coating consists of ZnSe.

17. The quantum dots of claim 16 wherein the quantum dot core comprises a Group III-V compound.

18. The quantum dots of claim 8 wherein the first coating consists of ZnS.

19. The quantum dots of claim 18 wherein the quantum dot core comprises a Group III-V compound.

* * * * *